(12) United States Patent
Li

(10) Patent No.: US 12,080,836 B2
(45) Date of Patent: Sep. 3, 2024

(54) ELECTRONIC DEVICE

(71) Applicant: PANELSEMI CORPORATION, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 766 days.

(21) Appl. No.: 17/262,605

(22) PCT Filed: May 20, 2020

(86) PCT No.: PCT/CN2020/091206
§ 371 (c)(1),
(2) Date: Jan. 22, 2021

(87) PCT Pub. No.: WO2020/238717
PCT Pub. Date: Dec. 3, 2020

(65) Prior Publication Data
US 2021/0265546 A1 Aug. 26, 2021

(30) Foreign Application Priority Data

May 24, 2019 (CN) .......................... 201910438448.4
May 8, 2020 (CN) .......................... 202010389540.9

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2933/0066* (2013.01)

(58) Field of Classification Search
None
See application file for complete search history.

(56) References Cited

U.S. PATENT DOCUMENTS

2012/0223875 A1  9/2012  Lau
2014/0264344 A1  9/2014  Liao
(Continued)

FOREIGN PATENT DOCUMENTS

CN  107452763 A  12/2017
CN  109461386 A   3/2019
(Continued)

*Primary Examiner* — Jack S Chen
(74) *Attorney, Agent, or Firm* — MUNCY, GEISSLER, OLDS & LOWE, P.C.

(57) ABSTRACT

An electronic device and a manufacturing method thereof are provided. The pattern circuit of each surface mount structure of the electronic device is disposed on the substrate; at least two through holes are respectively corresponding to at least two signal lines of the pattern circuit; and the two ends of at least one optoelectronic element are respectively electrically connected to at least two signal lines of the pattern circuit. Each connection pad group of the driving circuit board is corresponding to each surface mount structure, and at least two connection pads are respectively corresponding to the at least two through holes of the surface mount structure. At least two conductive members of each conductive member unit are disposed in the at least two through holes of the surface mount structure, respectively, and extending to the first surface and the second surface of the substrate. The conductive member disposed in each through hole electrically connects the signal lines of each surface mounting structure to the connection pads of each connection pad group of the driving circuit board.

13 Claims, 22 Drawing Sheets

(56) References Cited

U.S. PATENT DOCUMENTS

| | | |
|---|---|---|
| 2018/0337196 A1 | 11/2018 | Yang |
| 2019/0124764 A1 | 4/2019 | Li |
| 2020/0006404 A1 | 1/2020 | Li |
| 2021/0265546 A1* | 8/2021 | Li .......................... H01L 33/62 |

FOREIGN PATENT DOCUMENTS

| | | | |
|---|---|---|---|
| JP | 2005322937 | A | 11/2005 |
| KR | 20130092896 | A | 8/2013 |
| KR | 20170101334 | A | 9/2017 |
| KR | 20190006430 | A | 1/2019 |
| TW | 200611429 | A | 4/2006 |
| TW | 201322510 | A | 6/2013 |
| TW | 201902313 | A | 1/2019 |
| TW | 201917853 | A | 5/2019 |
| TW | 202002107 | A | 1/2020 |
| WO | 2017043216 | A1 | 3/2017 |

* cited by examiner

ELECTRONIC DEVICE

BACKGROUND

Technology Field

The present disclosure relates to an electronic device and a manufacturing method thereof, which are different from the conventional surface mount technology (SMT).

Description of Related Art

In the field of manufacturing electronic devices, the surface mount technology (SMT) is a technology for soldering electronic parts on the surface of, for example, a printed circuit board (PCB). Different from the earlier through-hole parts, the use of SMT could greatly reduce the volume of electronic products, thereby achieving the goal of lighter, thinner, and smaller.

Conventionally, the surface mount component is usually welded to the contact points of the circuit board by solder paste. In practice, the solder paste is printed on the solder pads (or pads) of the circuit board corresponding to the position of the component, and then the surface mount component is disposed on the solder pads, thereby aligning the pins of the surface mount component to the positions of the solder paste. After melting the solder paste to the liquid state through a high temperature reflow furnace, the liquid solder paste will cover the pins of the surface mount component. Then, the surface mount component could be soldered on the circuit board after cooling.

SUMMARY

An objective of this disclosure is to provide an electronic device and a manufacturing method thereof, which are different from the conventional surface mount component and the driving circuit board connection technology.

To achieve the above, an electronic device of this disclosure comprises a plurality of surface mount structures, a driving circuit board, and a plurality of conductive member units. Each of the surface mount structures comprises a substrate, a pattern circuit, at least two through holes, and at least one optoelectronic element. The substrate is defined with a first surface and a second surface opposite to each other. The pattern circuit is disposed on the first surface of the substrate, and the pattern circuit comprises at least two signal lines. The at least two through holes communicate the first surface and the second surface of the substrate, and the at least two through holes are disposed corresponding to the at least two signal lines, respectively. The at least one optoelectronic element is disposed on the first surface of the substrate, and two ends of the at least one optoelectronic element are respectively electrically connected to the at least two signal lines of the pattern circuit. The driving circuit board comprises a plurality of connection pad groups. Each of the connection pad groups is disposed corresponding to each of the surface mount structures, and the second surface of the substrate of each of the surface mount structures is disposed on a surface of the driving circuit board configured with the plurality of connection pad groups. Each of the connection pad groups comprises at least two connection pads, and the at least two connection pads are respectively corresponding to the at least two through holes of the surface mount structure. The conductive member units correspond to the surface mount structures. Each of the conductive member units comprises at least two conductive members, and the at least two conductive members are disposed in the at least two through holes of the surface mount structure, respectively, and extending to the first surface and the second surface of the substrate. The at least two conductive members disposed in the at least two through holes electrically connect the at least two signal lines of each of the surface mounting structures to the at least two connection pads of each of the connection pad groups of the driving circuit board.

To achieve the above, an electronic device of this disclosure comprises a surface mount structure, a driving circuit board, and a conductive member unit. The surface mount structure comprises a substrate, a pattern circuit, at least two through holes, and at least one optoelectronic element. The substrate is defined with a first surface and a second surface opposite to each other. The pattern circuit is disposed on the first surface of the substrate, and the pattern circuit comprises at least two signal lines. The at least two through holes communicates the first surface and the second surface of the substrate, and the at least two through holes are disposed corresponding to the at least two signal lines, respectively. The at least one optoelectronic element is disposed on the first surface of the substrate, and two ends of the at least one optoelectronic element are respectively electrically connected to the at least two signal lines of the pattern circuit. The driving circuit board comprises a connection pad group. The connection pad group is disposed corresponding to the surface mount structure, and the second surface of the substrate of the surface mount structure is disposed on a surface of the driving circuit board configured with the connection pad group. The connection pad group comprises at least two connection pads, and the at least two connection pads are respectively corresponding to the at least two through holes of the surface mount structure. The conductive member unit corresponds to the surface mount structure, and the conductive member unit comprises at least two conductive members. The at least two conductive members are disposed in the at least two through holes of the surface mount structure, respectively, and extending to the first surface and the second surface of the substrate. The at least two conductive members disposed in the at least two through holes electrically connect the at least two signal lines of the surface mounting structure to the at least two connection pads of the connection pad group of the driving circuit board.

In some embodiments, a material of the conductive members comprises a solder paste, a copper paste, a silver paste, or a combination thereof.

In some embodiments, the electronic device further comprises a plurality of adhesion members disposed between the plurality of surface mount structures and the driving circuit board, and each of the adhesion members is disposed corresponding to each of the surface mount structures.

In some embodiments, the electronic device further comprises at least one adhesion member disposed between the surface mount structure and the driving circuit board.

In some embodiments, each of the driving circuit board and the substrate defines a side edge along a direction, and the side edge of the driving circuit board and the side edge of the substrate define a gap.

In some embodiments, the electronic device comprises a plurality of the optoelectronic elements, the plurality of optoelectronic elements define a pixel pitch, and the gap between the side edge of the driving circuit board and the side edge of the substrate is less than two times of the pixel pitch along the direction.

In some embodiments, the electronic device further comprises a conductive sub-member, which is at least partially overlapped with the through hole and electrically connected to the conductive member located in the through hole and a conductive pad extended from a corresponding one of the signal lines.

In some embodiments, the substrate of the surface mount structure further defined with a periphery connecting to the first surface and the second surface, and the at least two through holes are not located at the periphery of the substrate.

In some embodiments, in the surface mount structure and the corresponding conductive member unit, a number of the conductive members is less than a number of the through holes.

In some embodiments, the surface mount structure is configured with two or more signal lines and two or more optoelectronic elements, each of the signal lines corresponds to two or more through holes, and at least two of the optoelectronic elements on the same one of the signal lines share the same one of the through holes and the corresponding conductive member.

In some embodiments, the at least one optoelectronic element of the surface mount structure comprises a chip or a package, the chip or the package comprises one or more LEDs, one or more mini LEDs, one or more micro LEDs, one or more image sensors, or any of their combination.

In some embodiments, the pattern circuit of the surface mount structure comprises a thin-film circuit or a thin-film element.

To achieve the above, a manufacturing method of an electronic device of this disclosure comprises: providing a surface mount structure, wherein the surface mount structure comprises a substrate, a pattern circuit, at least two through holes, and at least one optoelectronic element, the substrate is defined with a first surface and a second surface opposite to each other, the pattern circuit is disposed on the first surface of the substrate, the pattern circuit comprises at least two signal lines, the at least two through holes communicates the first surface and the second surface of the substrate, the at least two through holes are disposed corresponding to the at least two signal lines, respectively, the at least one optoelectronic element is disposed on the first surface of the substrate, and two ends of the at least one optoelectronic element are respectively electrically connected to the at least two signal lines of the pattern circuit; providing a driving circuit board and disposing the second surface of the substrate of the surface mount structure on a surface of the driving circuit board configured with a connection pad group, wherein the connection pad group corresponds to the surface mount structure and comprises at least two connection pads, and the at least two connection pads are respectively corresponding to the at least two through holes of the surface mount structure; and disposing a conductive material in the at least two through holes of the surface mount structure to form at least two conductive members, wherein the at least two conductive members extend to the first surface and the second surface of the substrate, and the at least two conductive members disposed in the at least two through holes electrically connect the at least two signal lines of the surface mounting structure to the at least two connection pads of the connection pad group of the driving circuit board.

In some embodiments, the step of providing the surface mount structure further comprises: defining a periphery of the substrate of the surface mount structure to connect to the first surface and the second surface, wherein the at least two through holes are not located at the periphery of the substrate.

In some embodiments, the step of providing the surface mount structure further comprises: configuring each of the signal lines of the surface mount structure to correspond to two or more of the through holes; and the step of disposing the conductive material further comprises: optionally jetting the conductive material into the through holes, wherein a number of the conductive members is less than a number of the through holes.

In some embodiments, the step of providing the surface mount structure further comprises: configuring a plurality of optoelectronic elements in the surface mount structure, wherein each of the optoelectronic elements comprises one or more chips; and before or after the step of disposing the conductive material, the manufacturing method further comprises: discontinuously coating an encapsulation layer on the substrate of the surface mount structure for covering each of the optoelectronic elements, wherein the encapsulation layer does not cover the at least two through holes.

In some embodiments, the step of providing the surface mount structure further comprises: configuring a plurality of optoelectronic elements in the surface mount structure, wherein each of the optoelectronic elements comprises one or more chips; and after the step of disposing the conductive material, the manufacturing method further comprises: discontinuously coating an encapsulation layer on the substrate of the surface mount structure for covering each of the optoelectronic elements.

In some embodiments, the step of providing the driving circuit board further comprises: forming at least one adhesion member on the driving circuit board, wherein the surface mount structure is disposed corresponding to and positioned on the driving circuit board through the at least one adhesion member.

As mentioned above, in the electronic device and the manufacturing method thereof of this disclosure, the surface mount structure has a substrate, a pattern circuit, at least two through holes, and at least one optoelectronic element. The pattern circuit comprises at least two signal lines. The at least two through holes communicate the first surface and the second surface of the substrate, and the at least two through holes are disposed corresponding to the at least two signal lines, respectively. The at least one optoelectronic element is disposed on the first surface of the substrate, and two ends of the at least one optoelectronic element are respectively electrically connected to the at least two signal lines of the pattern circuit. The connection pad group of the driving circuit board comprises at least two connection pads, and the at least two connection pads are respectively corresponding to the at least two through holes of the surface mount structure. At least two conductive members of the conductive member unit are disposed in the at least two through holes of the surface mount structure, respectively, and extending to the first surface and the second surface of the substrate. The at least two conductive members disposed in the at least two through holes electrically connect the at least two signal lines of each of the surface mounting structures to the at least two connection pads of each of the connection pad groups of the driving circuit board. According to the structural design of this disclosure, the electronic device and manufacturing method thereof of this disclosure could be different from the conventional surface mount component and the driving circuit board connection technology.

DETAILED DESCRIPTION OF THE DISCLOSURE

Some embodiments of the electronic devices and the manufacturing methods thereof according to this disclosure will be apparent from the following detailed description, which proceeds with reference to the accompanying drawings, wherein the same references relate to the same elements.

The applicant of this application entitled "Electronic device and manufacturing method thereof" also owns the following pending Taiwan applications including: (1) Patent Application No. 107122662, entitled "Electronic device and manufacturing method thereof"; (2) Patent Application No. 108107174, entitled "Electronic device and manufacturing method thereof"; (3) Patent Application No. 106136523, entitled "Electronic device and manufacturing method thereof"; and (4) Patent Application No. 106116725, entitled "Electronic device and manufacturing method thereof"; the entire contents of which are hereby incorporated by reference.

An electronic device of this disclosure comprises at least one surface mount structure, a driving circuit board, and at least one conductive member unit. To be noted, the numbers of the connection pad groups of the conductive member unit, the surface mount structure, and the driving circuit board could be corresponding to each other. At least two conductive members of each conductive member unit are disposed in at least two through holes of each surface mount structure, respectively, for contacting at least two connection pads of each connection pad group, thereby electrically connecting each surface mounting structure to the driving circuit board through each conductive member unit. Different embodiments of the electronic device of this disclosure could be achieved through the corresponding numbers of the surface mount structures, the connection pad groups and the conductive member units, and various arrangements and combinations of the connection pads in the connection pad group, the conductive members in the conductive member unit and the through holes of the surface mount structure. To be noted, the surface mount structure and the driving circuit board could be reasonably realized as two independent assembles made through separate manufacturing processes, and through the method within the scope of this disclosure or any equivalent implementation method thereof, various arrangements and combinations of different numbers of the surface mount structures and the driving circuit board are possible, so that the flexibility and applications thereof are quite extensive. The respective embodiments will be described hereinbelow.

Figure 1A:
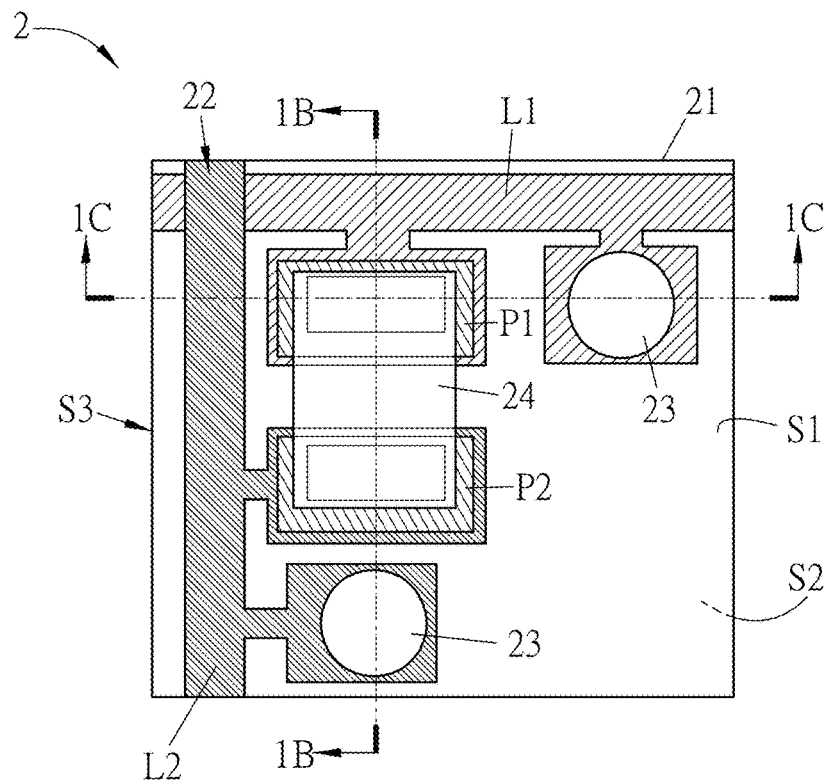
FIG. 1A is a schematic diagram showing the layout of a surface mount structures according to an embodiment of this disclosure.
Figure 1B:
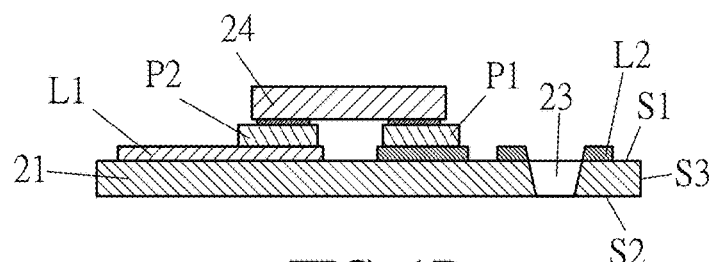
FIGS. 1B and 1C are sectional views of FIG. 1A along the line 1B-1B and the line 1C-1C, respectively.
Figure 1C:
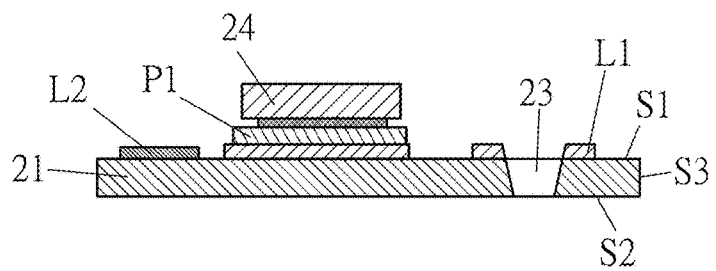
Figure 2:
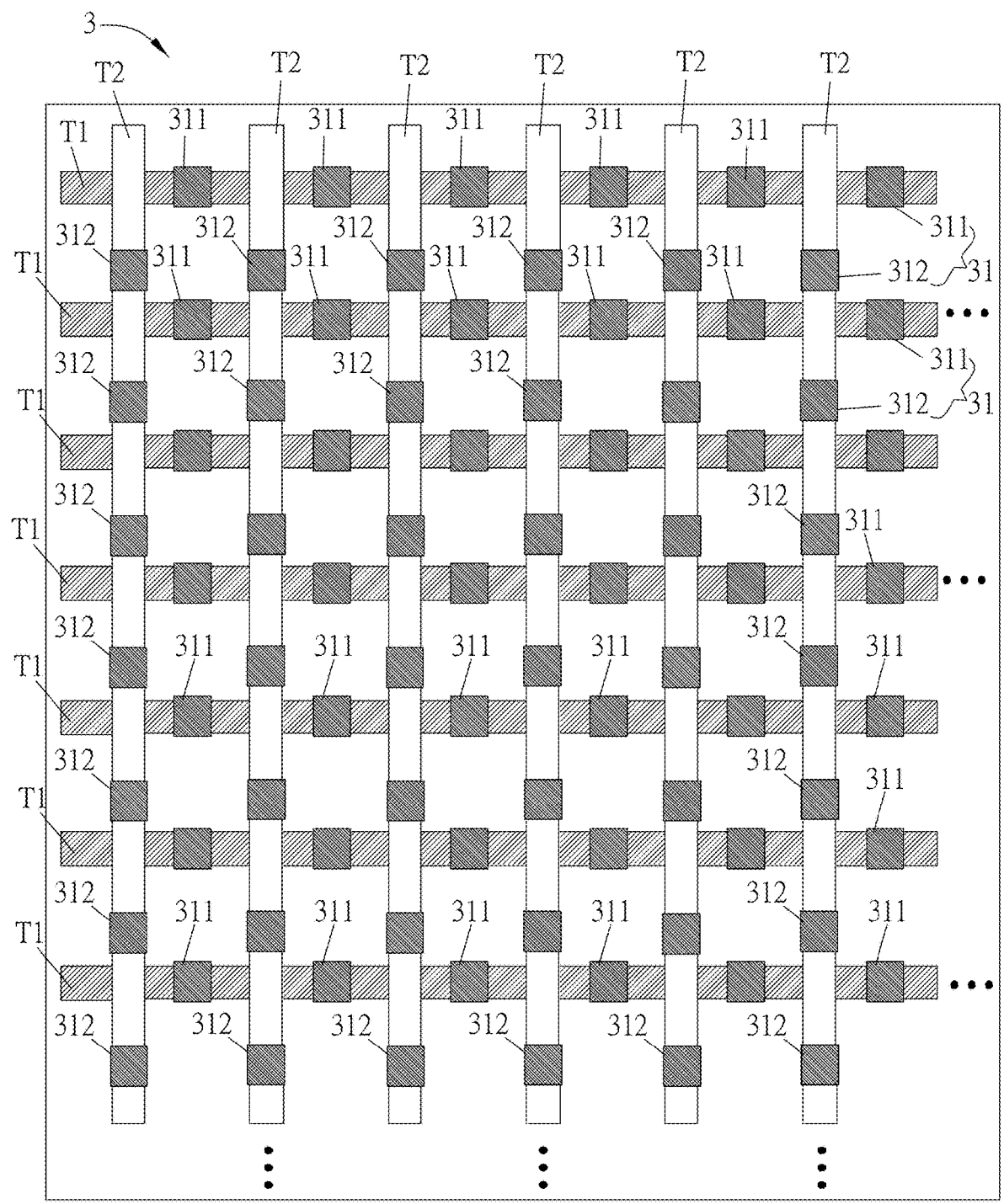
FIG. 2 is a schematic diagram showing the layout of a driving circuit board according to an embodiment of this disclosure.
Figure 3:
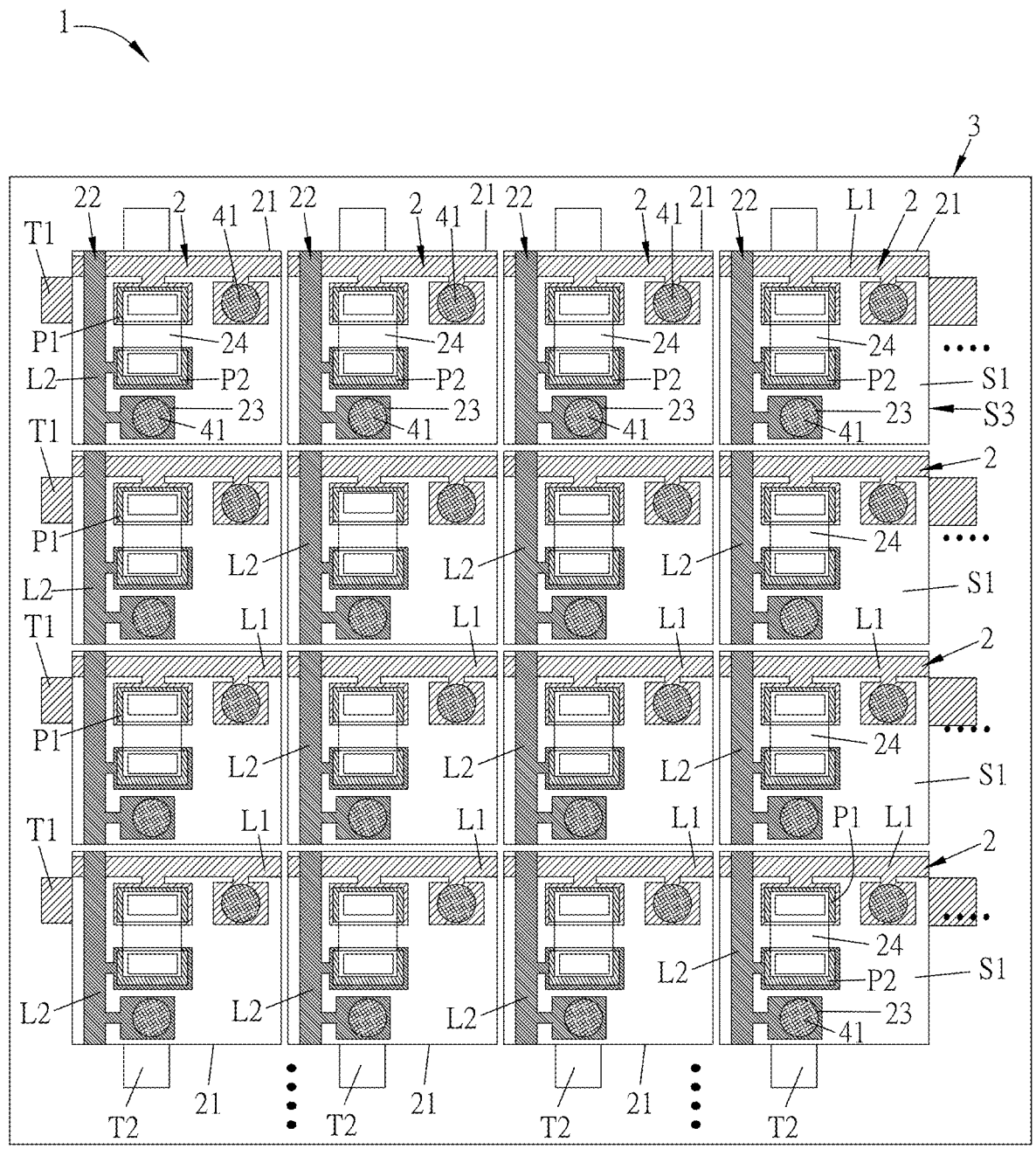
FIG. 3 is a schematic diagram showing the layout of an electronic device according to an embodiment of this disclosure.

FIG. 1A is a schematic diagram showing the layout of a surface mount structures according to an embodiment of this disclosure, FIGS. 1B and 1C are sectional views of FIG. 1A along the line 1B-1B and the line 1C-1C, respectively, FIG. 2 is a schematic diagram showing the layout of a driving circuit board according to an embodiment of this disclosure, and FIG. 3 is a schematic diagram showing the layout of an electronic device according to an embodiment of this disclosure.

As shown in FIG. 3, an electronic device 1 comprises a plurality of surface mount structures 2, a driving circuit board 3, and a plurality of conductive member units. The plurality of surface mount structures 2 are disposed on the driving circuit board 3 and electrically connected to the driving circuit board 3 through the corresponding conductive member units, respectively. In this embodiment, the plurality of surface mount structures 2 are, for example, arranged in a two-dimensional array on the driving circuit board 3, so that the driving circuit board 3 could drive the surface mount structures 2. In different embodiments, the surface mount structures 2 could be disposed in any of other arrangements, such as the one-dimensional arrangement or the irregular arrangement, and this disclosure is not limited. Herein, the surface mount structures are, for example, PM (passive matrix) optoelectronic structures, and the driving circuit board 3 is applied to passive matrix, so that the electronic device 1 is functioned as a PM device. In different embodiments, if the driving circuit board is applied to active matrix (AM), the electronic device could be functioned as an AM device.

As shown in FIGS. 1A to 1C, each surface mount structure 2 comprises a substrate 21, a pattern circuit 22, at least two through holes 23, and at least one optoelectronic element 24.

The substrate 21 is defined with a first surface S1 and a second surface S2 opposite to each other. In this embodiment, the substrate 21 could be an insulation substrate, or a conductive substrate with an additional insulation layer. The substrate 21 could be a flexible substrate or a rigid substrate, and this disclosure is not limited.

The pattern circuit 22 is disposed on the first surface S1 of the substrate 21, and the pattern circuit 22 comprises at least two signal lines L1 and L2. In some embodiments, the pattern circuit 22 could comprise thin film lines and/or a thin film component. For example, the thin film lines could be conductive lines or an insulation layer, and the thin film component could be a thin film transistor, a capacitor, a resistor, or the like. In this embodiment, for example, the pattern circuit 22 comprises thin film lines, and further comprises two signal lines L1 and L2 and the conductive pattern connected to the signal lines L1 and L2. To be noted, the pattern circuit 22 is a general term, and any film layer or component formed on the substrate 21 could be named as a pattern circuit. In some embodiments, the pattern circuit 22 may also comprise wires or lines for transmitting signals, such as scanning lines or data lines, depending on the function and use of the electronic device.

At least two through holes 23 communicate the first surface S1 and the second surface S2 of the substrate 21 (FIG. 1B and FIG. 1C), and the at least two through holes 23 are disposed corresponding to the at least two signal lines L1 and L2, respectively. In this embodiment, for example, the surface mount structure 2 comprises two through holes 23, and the two through holes 23 are located on the conductive pads, which extend from the at least two signal lines L1 and L2, respectively. Specifically, one through hole 23 corresponds to the signal line L1 and is located on the conductive pattern connecting to the signal line L1, and the other through hole 23 corresponds to the signal line L2 and is located on the conductive pattern connecting to the signal line L2. In addition, the substrate 23 of the surface mount structure 2 of this embodiment is further defined with a periphery S3, which is connected to the first surface S1 and the second surface S2, and the two through holes 23 are disposed on the inner side of the substrate 21 instead of the periphery S3 of the substrate 21. Compared with the conventional surface mount component, which is configured with the through holes at the periphery of the substrate and utilizes the conductive material disposed in the through holes to electrically connect to the driving circuit board, this embodiment is to configure two through holes 23 at the inner side of the substrate 21, so that the design for electrically connecting the surface mount structure 2 to the driving circuit board 3 could occupy a smaller space, thereby increasing the component density of the electronic device 1 under the premise of the same size (i.e. improve the resolution of electronic device).

At least one optoelectronic element 24 is disposed on the first surface S1 of the substrate 21, and two ends of the at least one optoelectronic element 24 are respectively electrically connected to the at least two signal lines L1 and L2 of the pattern circuit 22. The optoelectronic element 24 comprises a chip or a package, which could be, for example but not limited to, one or more LEDs, one or more mini LEDs, one or more micro LEDs, one or more image sensors, or any of their combination. In this embodiment, the surface mount structure 2 comprises one optoelectronic element 24 and comprises a flip-chip LED chip, which is correspondingly disposed on the conductive pattern connected to the signal lines L1 and L2 through two connection pads P1 and P2. Accordingly, the optoelectronic element 24 could respectively electrically connect to the two signal lines L1 and L2 of the pattern circuit 22 through the two connection pads P1 and P2. In some embodiments, the LED chip may emit red light, blue light, green light, UV light, IR light, or a light of any of other wavelengths, and this disclosure is not limited.

Referring to FIG. 2, the driving circuit board 3 comprises a plurality of connection pad groups 31, which are arranged in a two-dimensional array. Each of the connection pad groups 31 is disposed corresponding to each of the surface mount structures 2, and the second surface S2 of the substrate 21 of each surface mount structure 2 is disposed on a surface of the driving circuit board 3 configured with the plurality of connection pad groups 31 (see FIG. 3). In other words, in this embodiment, the lower surface (the second surface S2) of each surface mount structure 2 is disposed on the corresponding connection pad group 31 on the surface of the driving circuit board 3 (one surface mount structure 2 corresponds to one connection pad group 31). Herein, each connection pad group 31 comprises at least two connection pads 311 and 312, and the at least two connection pads 311 and 312 are respectively corresponding to the at least two through holes 23 of the surface mount structure 2. In this embodiment, each connection pad group 31 comprises two connection pads 311 and 312, which are disposed corresponding to the two through holes 23 for example (the sum of the numbers of the connection pads 311 and 312 is equal to the number of the through holes 23). Herein, the connection pad 311 corresponds to and connects to one through hole 23 of the surface mount structure 2 (the through hole 23 at up-right side), and the connection pad 312 corresponds to and connects to the other through hole 23 of the surface mount structure 2 (the through hole 23 at down-left side). Moreover, the driving circuit board 3 of this embodiment further comprises a plurality of interlaced wires T1 and T2, wherein the connection pads 311 of the connection pad groups 31 are sequentially disposed on the lateral wires T1, and the connection pads 312 of the connection pad groups 31 are sequentially disposed on the vertical wires T2.

Referring to FIGS. 1A and 3, the plurality of conductive member units correspond to the plurality of surface mount structures 2. Herein, each conductive member unit comprises at least two conductive members 41, and the at least two conductive members 41 are disposed in the at least two through holes 23 of the surface mount structure 2, respectively, and extending to the first surface S1 and the second surface S2 of the substrate 21. For example, each conductive member unit of this embodiment comprises two conductive members 41. The material of the conductive member 41 could be, for example but not limited to, a solder paste, a copper paste, a silver paste, or a combination thereof. In this case, the two conductive members 41 of each conductive member unit are disposed in the two through holes 23 of the surface mount structure 2, respectively, and extending to the first surface S1 and the second surface S2 of the substrate 21. In this embodiment, the number of the conductive members 41 is equal to the number of the through holes 23. Accordingly, the conductive members 41 disposed in the through holes 23 of each surface mount structure 2 could electrically connect the two signal lines L1 and L2 of each surface mounting structure 2 to the two connection pads 311 and 312 of each connection pad group 31 of the driving circuit board 3. In other words, due to the configuration of the two through holes 23 disposed at the inner side of the surface mount structure 2, the conductive member unit (two conductive members 41) in the two through holes 23, and the connection pad group 31 (the connection pads 311 and 312) on the driving circuit board 3, the driving circuit board 3 of this embodiment could be electrically connected to the corresponding optoelectronic element 24 through the corresponding connection pads 311 and 312, the corresponding conductive members 41, and the corresponding signal lines L1 and L2, thereby driving the corresponding optoelectronic element 24 (LED) to emit light.

Figure 4A:
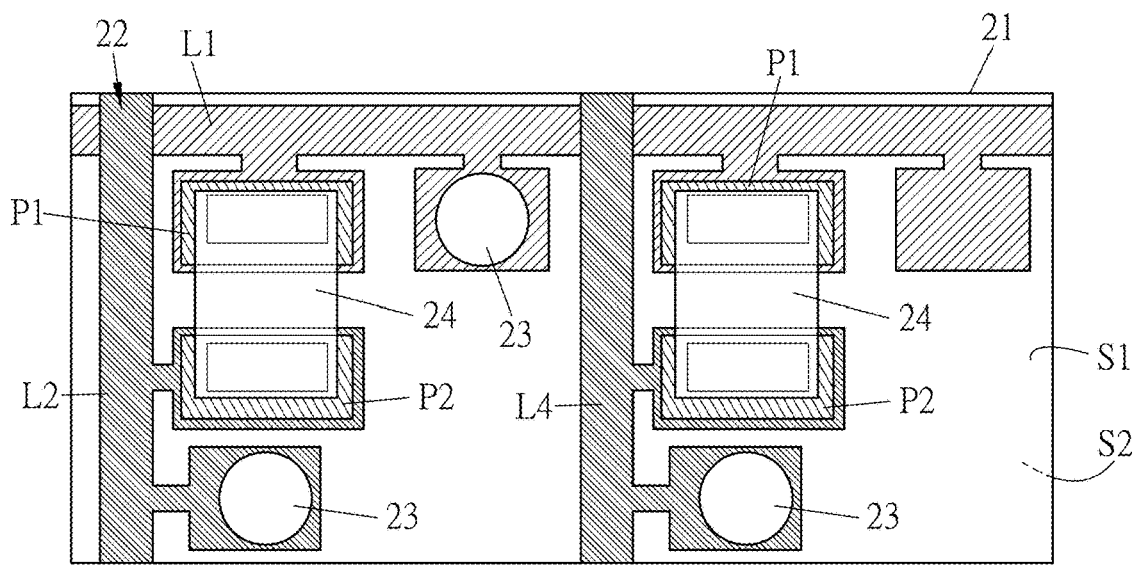
FIGS. 4A and 4B are schematic diagrams showing the layouts of surface mount structures according to different embodiments of this disclosure.
Figure 4B:
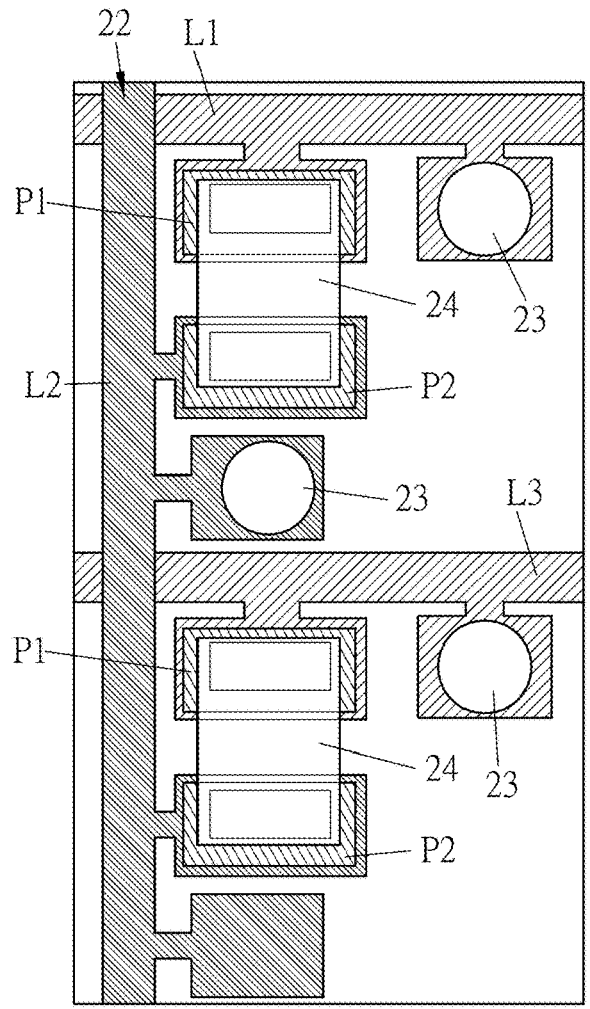

FIGS. 4A and 4B are schematic diagrams showing the layouts of surface mount structures according to different embodiments of this disclosure.

Different from the surface mount structure 2 of the previous embodiment as shown in FIG. 1A, which comprises only two signal lines L1 and L2 and one optoelectronic element 24, the surface mount structure of FIGS. 4A and 4B comprises three signal lines and two optoelectronic elements 24. In the aspect of FIG. 4A, the two optoelectronic elements 24 are arranged in lateral (1*2); in the aspect of FIG. 4B, the two optoelectronic elements 24 are arranged in vertical (2*1).

As shown in FIG. 4A, the surface mount structure comprises three signal lines (including an additional signal line L4) and two optoelectronic elements 24. The left optoelectronic element 24 is electrically connected to the signal line L1 and the signal line L2, and further electrically connected to the driving circuit board through the signal lines L1 and L2 as well as the two corresponding through holes 23 (and two conductive members). The right optoelectronic element 24 is electrically connected to the signal line L1 and the signal line L4, and the signal line L4 is electrically connected to the driving circuit board through the corresponding through hole 23 (and the conductive member). Accordingly, the two optoelectronic elements 24 of FIG. 4A could share the commonly used through hole 23 (and the corresponding conductive member) on the same signal line L1. Based on the configuration of the commonly used through hole 23, the component density of the electronic device could be increased, and the total amount of through holes could be decreased with remaining the same amount of pixels (the same amount of optoelectronic elements 24), thereby decreasing the cost of drilling holes.

As shown in FIG. 4B, the surface mount structure also comprises three signal lines (including an additional signal line L3) and two optoelectronic elements 24. The upper optoelectronic element 24 is electrically connected to the signal line L1 and the signal line L2, and further electrically connected to the driving circuit board through the signal lines L1 and L2 as well as the two corresponding through holes 23 (and two conductive members). The lower optoelectronic element 24 is electrically connected to the signal line L2 and the signal line L3, and the signal line L3 is electrically connected to the driving circuit board through the corresponding through hole 23 (and the conductive member). Accordingly, the two optoelectronic elements 24 of FIG. 4B could share the commonly used through hole 23 (and the corresponding conductive member) on the same signal line L2. Based on the configuration of the commonly used through hole 23, the component density of the electronic device could be increased, and the cost could be decreased.

Figure 5A:
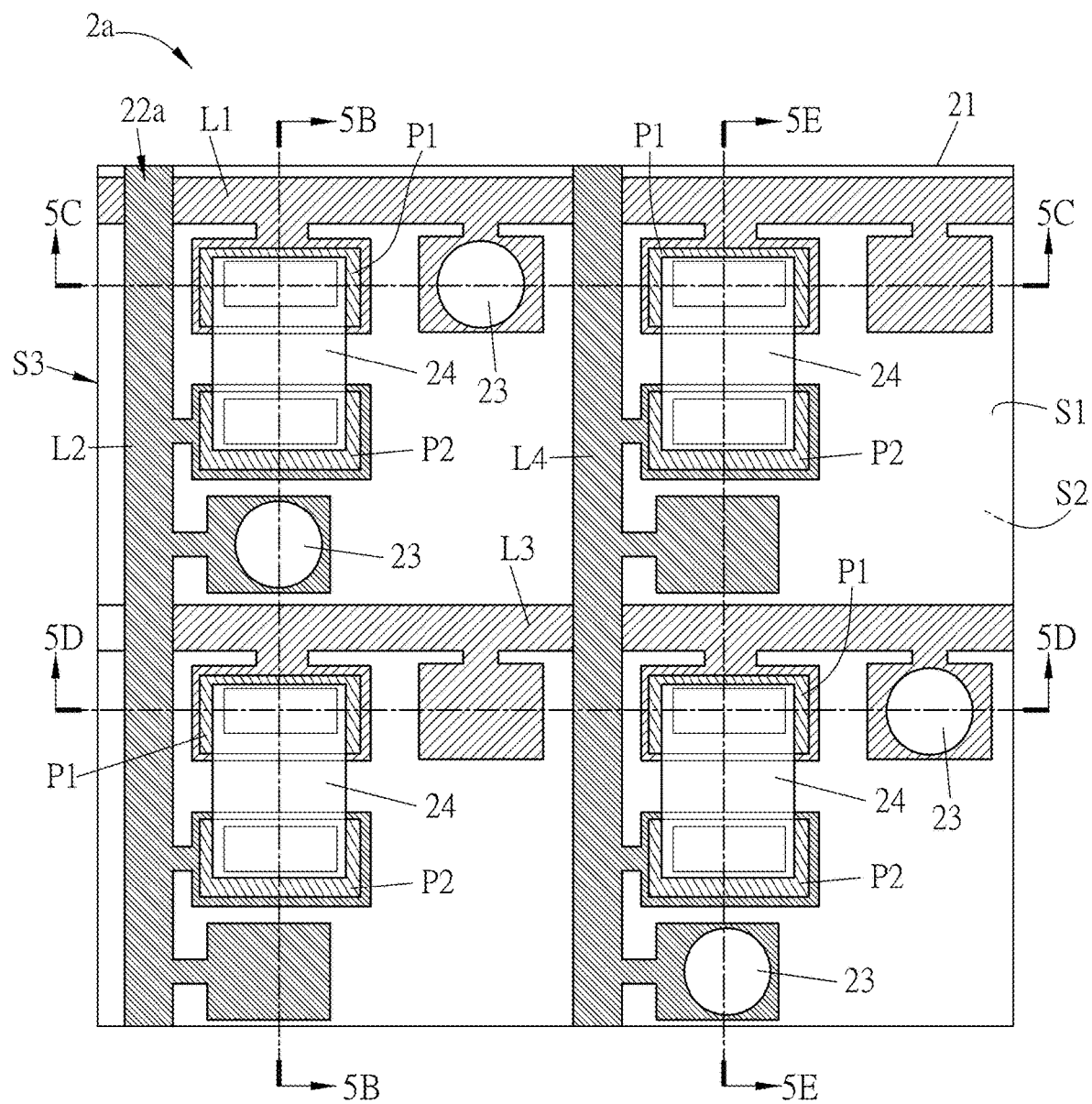
FIG. 5A is a schematic diagram showing the layout of a surface mount structure according to another embodiment of this disclosure.
Figure 5B:
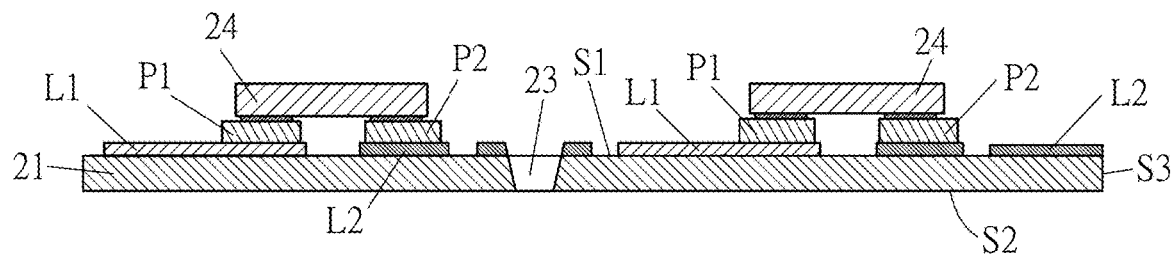
FIGS. 5B to 5E are sectional views of FIG. 5A along the line 5B-5B, the line 5C-5C, the line 5D-5D, and the line 5E-5E, respectively.
Figure 5C:
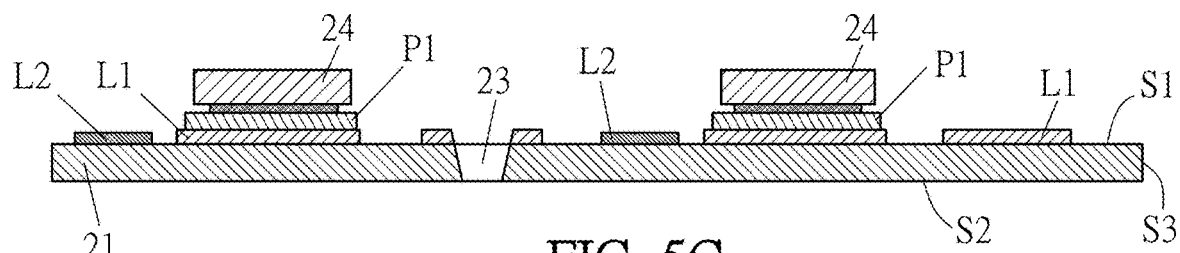
Figure 5D:
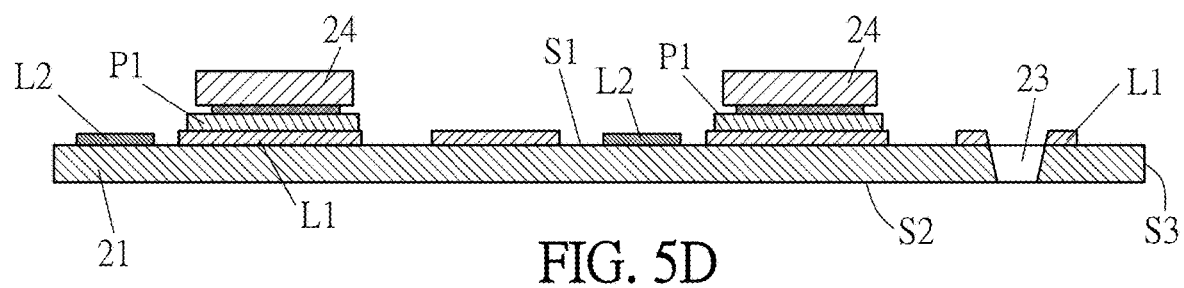
Figure 5E:
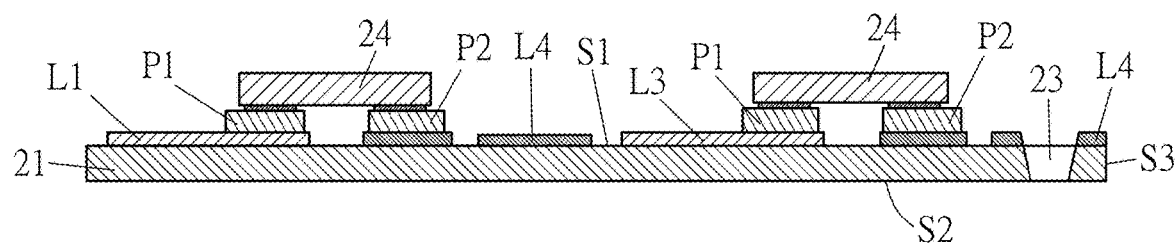
Figure 6:
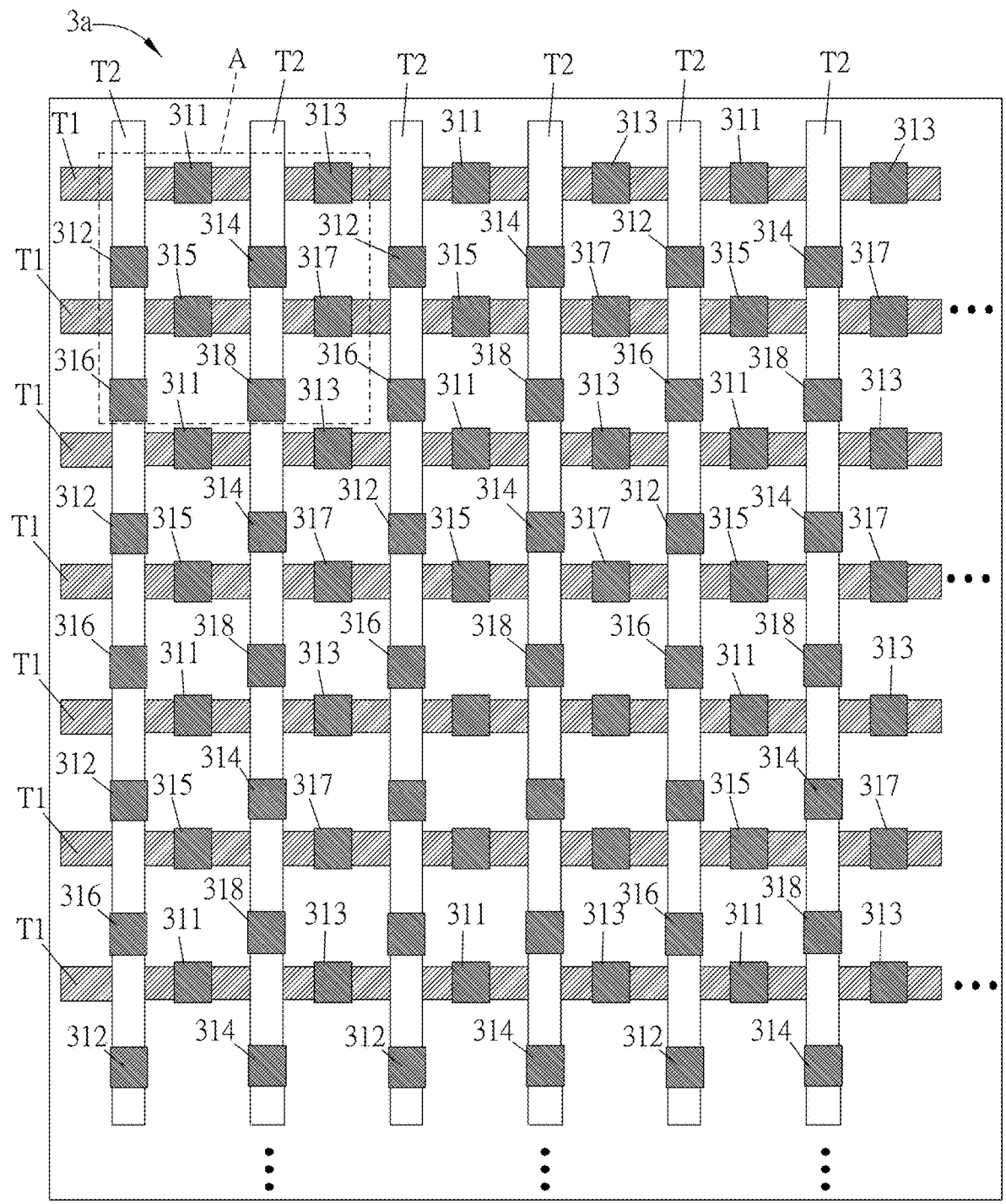
FIG. 6 is a schematic diagram showing the layout of a driving circuit board according to another embodiment of this disclosure.
Figure 7:
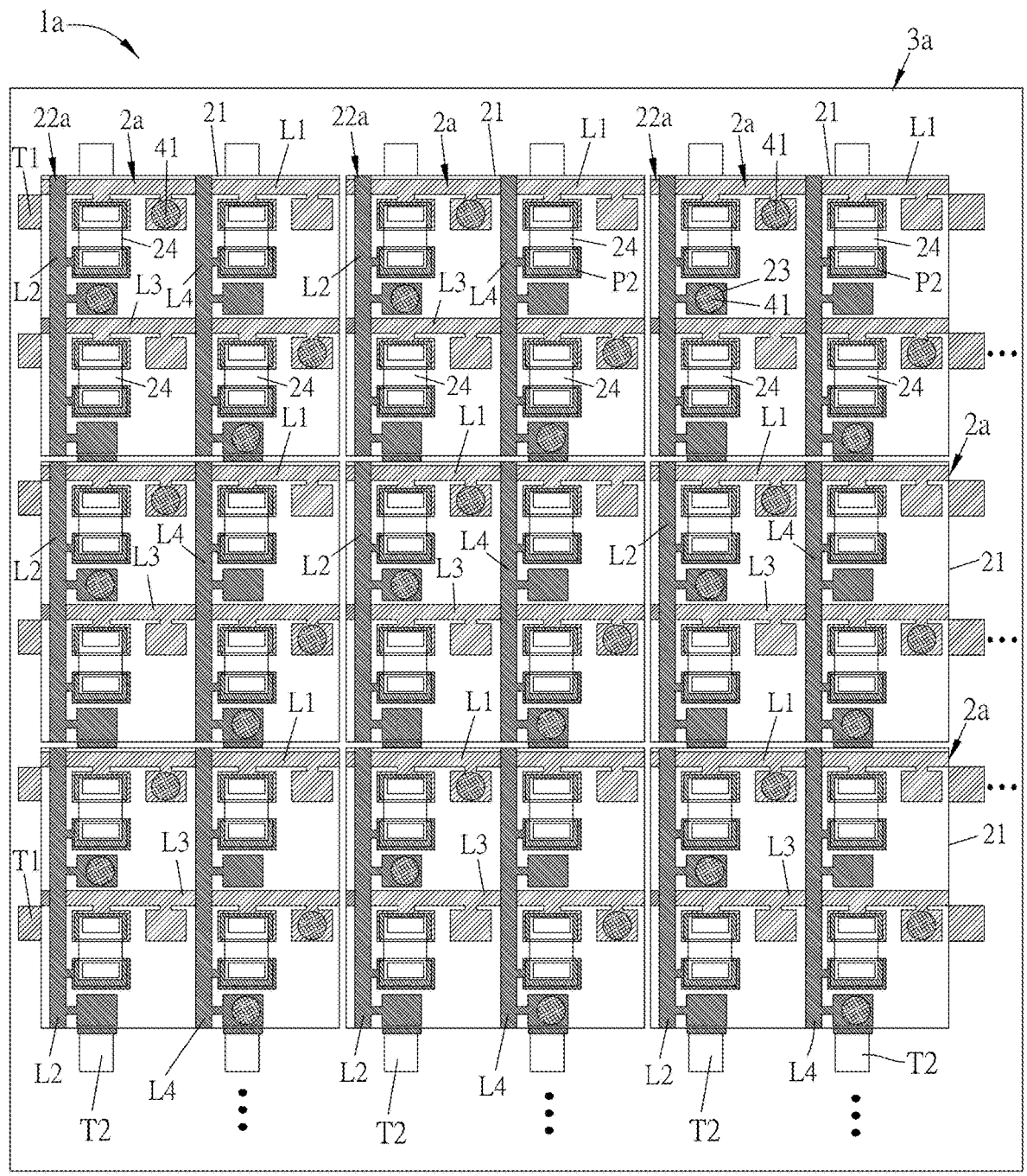
FIG. 7 is a schematic diagram showing the layout of an electronic device according to another embodiment of this disclosure.

In addition, please refer to FIGS. 5A to 7, wherein FIG. 5A is a schematic diagram showing the layout of a surface mount structure according to another embodiment of this disclosure; FIGS. 5B to 5E are sectional views of FIG. 5A along the line 5B-5B, the line 5C-5C, the line 5D-5D, and the line 5E-5E, respectively; FIG. 6 is a schematic diagram showing the layout of a driving circuit board according to another embodiment of this disclosure; and FIG. 7 is a schematic diagram showing the layout of an electronic device according to another embodiment of this disclosure.

Referring to FIG. 7, an electronic device 1a comprises a plurality of surface mount structures 2a, a driving circuit board 3a, and a plurality of conductive member units. The plurality of surface mount structures 2a are disposed on the driving circuit board 3a and electrically connected to the driving circuit board 3a through the corresponding conductive member units, respectively. In this embodiment, the plurality of surface mount structures 2a are also arranged in a two-dimensional array on the driving circuit board 3a, so that the driving circuit board 3a could drive the surface mount structures 2a. Of course, the surface mount structures 2a could be disposed in a one-dimensional arrangement, and this disclosure is not limited. Herein, the surface mount structures 2a are also, for example, PM (passive matrix) optoelectronic structures, and the driving circuit board 3a is applied to passive matrix, so that the electronic device 1a is functioned as a PM device.

As shown in FIG. 5A, different from the surface mount structure 2 of the previous embodiment, the surface mount structure 2a of FIG. 5A comprises four optoelectronic elements 24 on the substrate 21, and the four optoelectronic elements 24 are arranged in a 2*2 array. In addition, the surface mount structure 2a further comprises four signal lines L1, L2, L3 and L4.

As shown in FIG. 5A, in addition to the four signal lines L1, L2, L3 and L4, the pattern circuit 22a further comprises the conductive patterns connecting to the signal lines L1, L2, L3 and L4, respectively. Herein, the signal lines L1 and L3 are arranged in lateral and interlaced with the vertically arranged signal lines L2 and L4, thereby defining four pixels. Each pixel corresponds to one optoelectronic element 24. In addition, this embodiment comprises four through holes 23, and the through holes 23 (and the corresponding optoelectronic elements 24) correspond to the corresponding signal lines L1, L2, L3 and L4, respectively. In this case, the four through holes 23 are all located at the inner side of the substrate 21, and are not configured at the periphery S3 of the substrate 21. Accordingly, compared with the conventional art, the component density of the electronic device 1a could be increased under the premise of the same size.

In addition, as shown in FIG. 6, each connection pad group of the driving circuit board 3a of this embodiment comprises eight connection pads 311-318. Regarding the connection pad group in the up-left area A of FIG. 6, four connection pads 311, 312, 317 and 318 correspond to four through holes 23 of the surface mount structure 2a, respectively. In this embodiment, the number of the connection pads 311-318 (eight connection pads) is greater than the number of the through holes 23 (four through holes 23), and the number of the conductive members 41 of each conductive member unit is equal to the number of the through holes 23.

To be noted, in another embodiment, which has the same electrical connection configuration of the surface mount structures and the driving circuit board, in the surface mount structures and the corresponding conductive member unit, if the number of the conductive members 41 is less than the number of the through holes 23 (which means the case of more through holes 23 (more hole drilling) and less conductive members 41), since it is unnecessary to dispose the conductive members 41 in all of the through holes 23 of each surface mount structure and the corresponding optoelectronic elements could still be driven, the number of the conductive members 41 could be less than the number of the through holes 23. In this embodiment, the design of sharing the commonly used through hole 23 by at least two optoelectronic elements on the same signal line and the conductive member 41 corresponding to the above-mentioned commonly used through hole 23 could decrease the manufacturing cost of the electronic device (because less processes for manufacturing the conductive members 41 are needed, the cost could be decreased) with remaining the electronic device of the same pixels (the same amount of optoelectronic elements 24). In order to achieve flexibility to meet the needs of different clients, those skilled in the art could choose the conductive members with the same number as the through holes or the number less than the through holes when the same number of surface mount structures are produced, as long as the surface mount structures could be maintained in electrical connection with the driving circuit board, and the driving circuit board could drive the optoelectronic elements on the surface mount structures. In addition, the through holes, which are not disposed with the corresponding conductive members, could be introduced with the conductive members for electrical connection reinforcement when a defect occurs in the aforementioned process.

Moreover, referring to FIGS. 5A and 6, in the surface mount structure 2a of this embodiment, regarding the two upper (lateral) optoelectronic elements 24 electrically connected by the signal line L1, the two optoelectronic elements 24 on the same signal line L1 could share the same through hole 23 and the corresponding conductive member 41, and is electrically connected to the corresponding connection pad 311 of the driving circuit board 3a. Regarding the two lower (lateral) optoelectronic elements 24 electrically connected by the signal line L3, the two optoelectronic elements 24 on the same signal line L3 could also share the same through hole 23 and the corresponding conductive member 41, and is electrically connected to the corresponding connection pad 317 of the driving circuit board 3a.

In addition, regarding the two left (vertical) optoelectronic elements 24 electrically connected by the signal line L2, the two optoelectronic elements 24 on the same signal line L2 could share the same through hole 23 and the corresponding conductive member 41, and is electrically connected to the corresponding connection pad 312 of the driving circuit board 3a. Regarding the two right (vertical) optoelectronic elements 24 electrically connected by the signal line L4, the two optoelectronic elements 24 on the same signal line L4 could share the same through hole 23 and the corresponding conductive member 41, and is electrically connected to the corresponding connection pad 318 of the driving circuit board 3a. Accordingly, the configuration of the commonly used through holes 23 could not only increase the component density of the electronic device 1a, but also decrease the cost (due to less drilling holes than the optoelectronic elements 24 (pixels)).

Figure 8A:
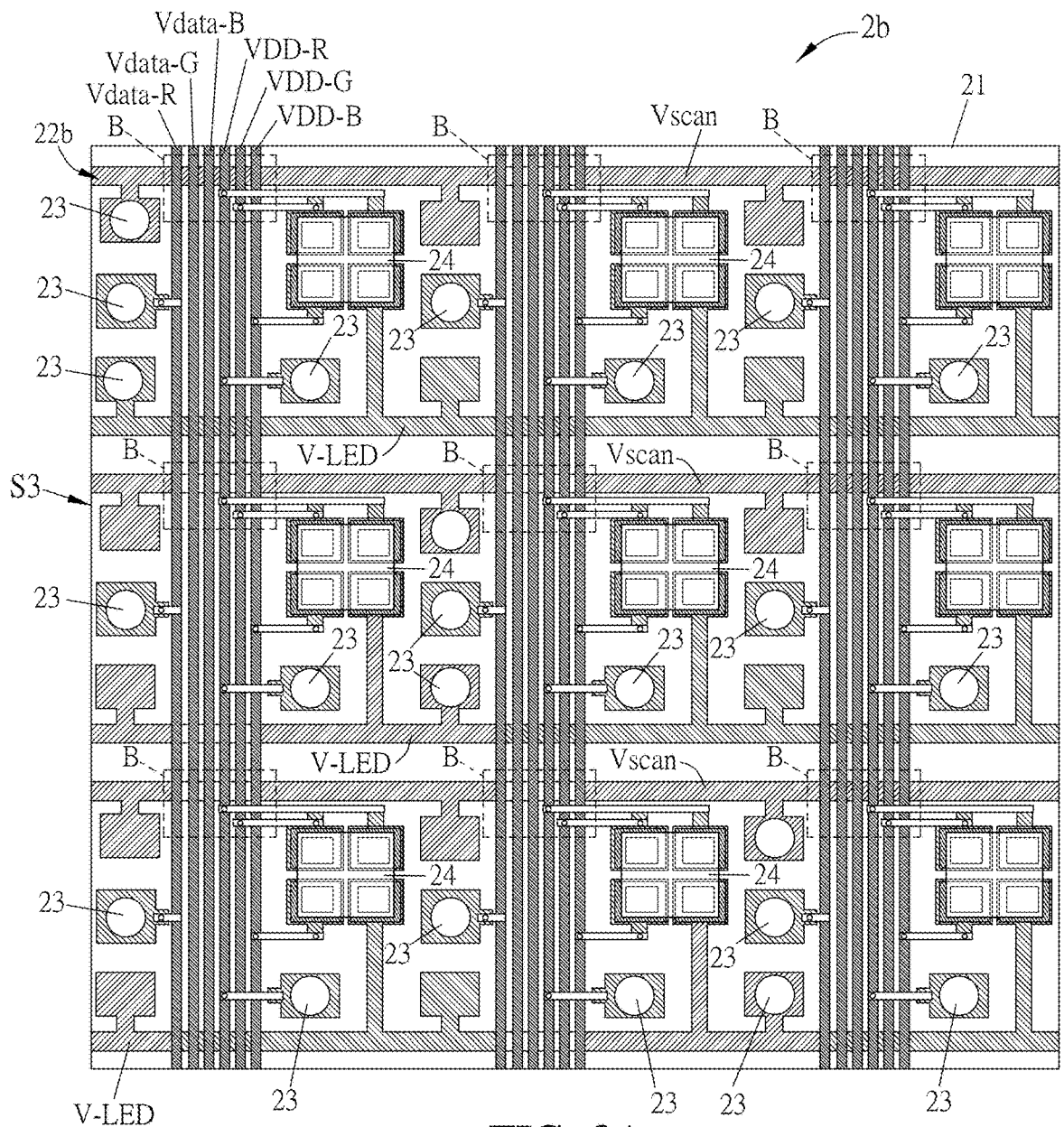
FIG. 8A is a schematic diagram showing the layout of a surface mount structure according to another embodiment of this disclosure.
Figure 8B:
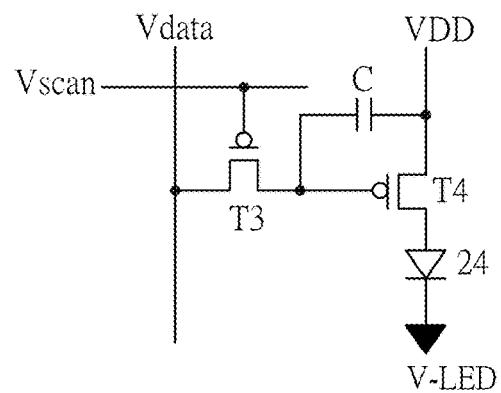
FIG. 8B is a schematic diagram showing the circuit of the surface mount structure of FIG. 8A.

FIG. 8A is a schematic diagram showing the layout of a surface mount structure according to another embodiment of this disclosure, and FIG. 8B is a schematic diagram showing the circuit of the surface mount structure of FIG. 8A. As shown in FIGS. 8A and 8B, for example, the surface mount structure 2b of this embodiment is an AM (active matrix) optoelectronic structure, and the driving circuit board is an AM driving circuit board, so that the assembled electronic device could be an AM device. In some embodiments, the plurality of surface mount structures 2b could be arranged in a two-dimensional array or in any of other arrangements on the driving circuit board, so that the driving circuit board could drive the optoelectronic elements 24 of the surface mount structures 2b.

As shown in FIG. 8A, different from the surface mount structure 2a of the previous embodiment, the surface mount structure 2b of this embodiment comprises nine optoelectronic elements 24, which are arranged in a 3*3 array (totally nine pixels). Herein, each optoelectronic element 24 (each pixel) comprises three LEDs, which construct three sub-pixels. Each sub-pixel comprises a LED chip, and three LEDs of the three sub-pixels could comprise a red LED, a blue LED and a green LED, thereby forming a full-color pixel so as to produce a full-color LED display device.

Regarding the up-left pixel of FIG. 8A, the signal lines of the pattern circuit 22b comprise a plurality of lateral signal lines Vscan and V-LED, which connect to the adjacent pixels, and a plurality of vertical signal lines Vdata-R, Vdata-G, Vdata-B, VDD-R, VDD-G and VDD-B, which connect to the adjacent pixels. Moreover, the pattern circuit 22b further comprises the thin film components, the circuits and the conductive patterns connecting to the signal lines, respectively, in the area B, and the details thereof could be referred to FIG. 8A. Herein, the thin film circuit in the area B may comprise the 2T1C circuit structure as shown in FIG. 8B (not shown in FIG. 8A). The 2T1C circuit structure as shown in FIG. 8B comprises two transistors T3 and T4, a plurality of signal lines and a capacitor C. The connection of components in the 2T1C circuit structure could be referred to FIG. 8B, so the detailed description thereof will be omitted here. In different embodiments, the thin film circuit in the area B could be any of other circuit structures, such as 4T2C or 5T1C circuit structure.

Accordingly, when the scan signal is transmitted through the signal line Vscan to conduct the transistor T3, the data signal could be transmitted through the signal line Vdata and the transistor T3 to the gate of the transistor T4 for conducting the transistor T4. Then, the data voltage could be transmitted to the corresponding optoelectronic element 24 through the signal line VDD and the transistor T4 to control the optoelectronic element 24 to emit light. Those skilled in the art could understand the operation principle and detailed process of each pixel according to the circuit structure of FIG. 8B and the component configuration of FIG. 8A, and the detailed description thereof will be omitted here.

In addition, the up-left pixel in FIG. 8A comprises four through holes 23 (the entire surface mount structure 2b comprises 24 through holes 23), and the pixel is electrically connected to the corresponding driving circuit board through the corresponding conductive members in the through holes 23, so that the driving circuit board could drive the optoelectronic elements 24 of the surface mount structure 2b to emit light. In addition, the surface mount structure 2b of FIG. 8A also has the configuration of the commonly used through holes 23.

In the surface mount structure 2b of this embodiment, the 24 through holes 23 are all disposed at the inner side of the substrate 21, and the periphery S3 of the substrate 21 is configured without any through hole 23. Accordingly, the component density of the electronic device could be increased under the premise of the same size, which means the number of pixels in the electronic device of the same size could still be increased. In addition, the number of the conductive members of each conductive member unit of this embodiment is equal to the number of the through holes 23. In another embodiment, which has the same electrical connection configuration of the surface mount structure 2b and the driving circuit board, in the surface mount structures 2b and the corresponding conductive member unit, if the number of the conductive members is less than the number of the through holes 23 (which means the case of more through holes 23 and less conductive members), since it is unnecessary to dispose the conductive members in all of the through holes 23 of each surface mount structure 2b and the corresponding optoelectronic elements 24 could still be driven, the number of the conductive members could be less than the number of the through holes 23. Accordingly, the manufacturing cost of the electronic device could be decreased.

In addition, this disclosure also provides a manufacturing method of an electronic device, which comprises: providing a plurality of surface mount structures, wherein each surface mount structure comprises a substrate, a pattern circuit, at least two through holes, and at least one optoelectronic element, the substrate is defined with a first surface and a second surface opposite to each other, the pattern circuit is disposed on the first surface of the substrate, the pattern circuit comprises at least two signal lines, the at least two through holes communicates the first surface and the second surface of the substrate, the at least two through holes are disposed corresponding to the at least two signal lines, respectively, the at least one optoelectronic element is disposed on the first surface of the substrate, and two ends of the at least one optoelectronic element are respectively electrically connected to the at least two signal lines of the pattern circuit (step S01); providing a driving circuit board and disposing the second surface of the substrate of each surface mount structure on a surface of the driving circuit board configured with a plurality of connection pad groups, wherein the connection pad groups correspond to the surface mount structures, respectively, each connection pad group comprises at least two connection pads, and the at least two connection pads are respectively corresponding to the at least two through holes of the surface mount structure (step S02); and disposing a conductive material in the at least two through holes of each surface mount structure to form at least two conductive members, wherein the at least two conductive members extend to the first surface and the second surface of the substrate, and the at least two conductive members disposed in the at least two through holes electrically connect the at least two signal lines of the surface mounting structure to the at least two connection pads of the connection pad group of the driving circuit board (step S03). Herein, the executing order of the step S02 and the step S03 could be changed. In other words, the step S02 of disposing each surface mount structure on the driving circuit board could be performed after the step S03 of disposing the conductive material.

The above-mentioned manufacturing method will be describe in detail with reference to FIGS. 9A to 9H hereinafter, wherein FIGS. 9A to 9H are schematic diagrams showing the manufacturing procedure of an electronic device according to an embodiment of this disclosure. To be noted, the following description relates to the manufacturing method of the electronic device 1a of FIG. 7, and those skilled in the art could realize the manufacturing procedures of the electronic device of other embodiments based on the described manufacturing method of the electronic device 1a.

The manufacturing procedures of a plurality of surface mount structures 2a of the electronic device 1a will be described in advance hereinafter.

Figure 9A:
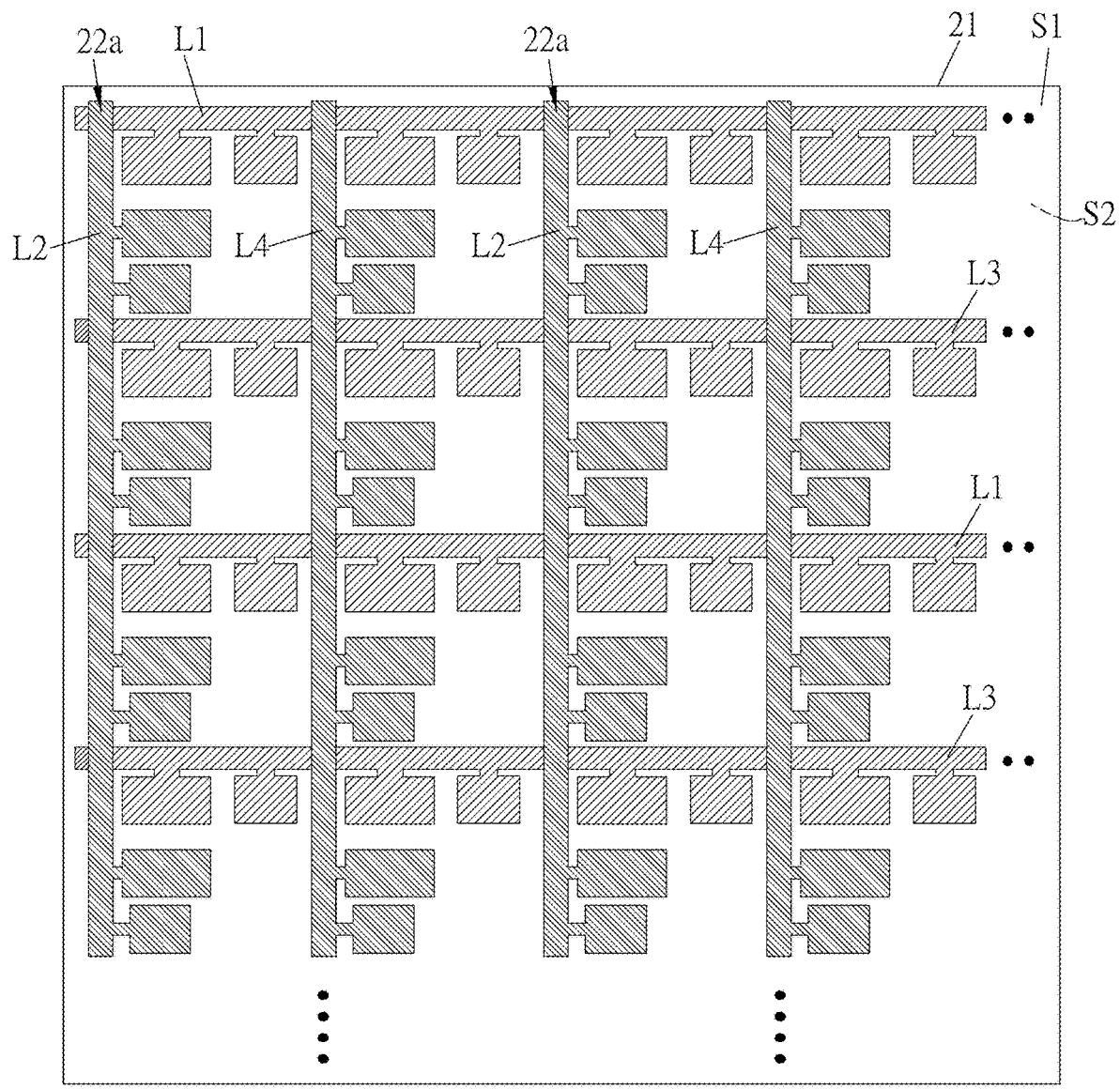
FIGS. 9A to 9H are schematic diagrams showing the manufacturing procedure of an electronic device according to an embodiment of this disclosure.

As shown in FIG. 9A, multiple signal lines L1 and multiple signal lines L3 are alternately disposed on a large-area substrate 21 and laterally arranged in parallel, and the conductive patterns connecting to the signal lines L1 and L3, respectively, are also formed on the substrate 21. Next, multiple signal lines L2 and multiple signal lines L4 are alternately disposed on the substrate 21 and vertically arranged in parallel, and the conductive patterns connecting to the signal lines L2 and L4, respectively, are also formed on the substrate 21, thereby obtaining a plurality of pattern circuits 22a. Herein, in order to avoid the short-circuit between the signal lines L1 and L3 and the signal lines L2 and L4, an insulation layer (not shown in FIG. 9A) must be formed on the signal lines L1 and L3 as well as the conductive patterns thereof before forming the signal lines L2 and L4 as well as the conductive patterns thereof. Then, the signal lines L2 and L4 as well as the conductive patterns thereof will be formed after forming the insulation layer.

In this embodiment, the substrate 21 defines a first surface S1 and a second surface S2 opposite to each other, and the pattern circuits 22a are formed on the first surface S1. In some embodiments, the substrate 21 could be a rigid substrate or a flexible substrate. If the substrate 21 is a flexible substrate, in order to smoothly form the components on the flexible substrate in the following processes and make the operation of the flexible substrate easier, the flexible substrate could be formed on a rigid carrier in advance, and the rigid carrier will be removed in the later step. If the substrate 21 is a rigid substrate, the step is not needed. The material of the substrate 21 comprises glass, resin, metal, ceramics, or composite materials. Herein, the resin material is a flexible material, and may comprise organic polymer material. The glass transition temperature (Tg) of the organic polymer material is, for example, between 250° C. and 600° C., and preferably between 300° C. and 500° C. Since the resin material with the organic polymer material has a relative higher glass transition temperature, the following thin-film processes could be performed directly on the substrate 21 to form the thin-film transistors and other components or wires. The organic polymer material could be a thermoplastic material, such as polyimide (PI), polyethylene (PE), polyvinylchloride (PVC), polystyrene (PS), acrylic, fluoropolymer, polyester, nylon, and the like.

The pattern circuit 22a could be a single-layer structure or a multilayer structure made by metal (e.g. Al, Cu, Ag, Mo, Ti, or the like) or the alloy thereof. Herein, the pattern circuit 22a could be formed on the substrate 21 by, for example, a thin film process. The pattern circuit 22a could be directly formed on the substrate 21; or the pattern circuit 22a could be indirectly formed on the substrate 21 via, for example, a buffer layer or an insulation layer. This disclosure is not limited. The above-mentioned thin film process could be a semiconductor manufacturing process, which comprises a low-temperature polycrystalline silicon (LTPS) process, an amorphous silicon (α-S1) process, or a metal oxide semiconductor process (e.g. IGZO), and this disclosure is not limited.

Figure 9B:
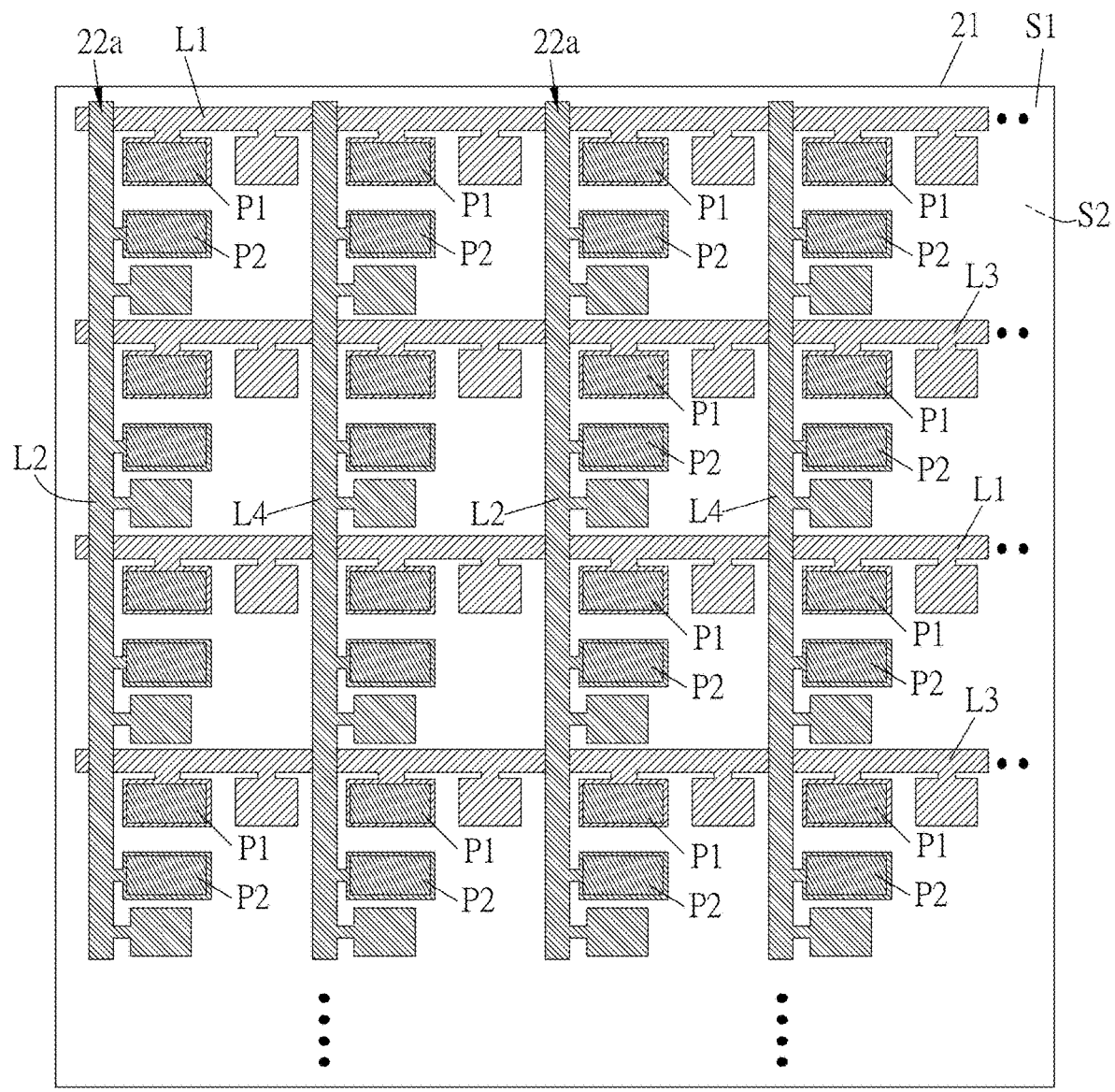

As shown in FIG. 9B, a plurality of connection pad groups (connection pads P1 and P2) are then formed on the conductive pattern correspondingly connected to the signal lines L1 and L2. The material of the connection pads P1 and P2 is, for example but not limited to, Cu, Ag, Au, or their combinations, or any of other suitable conductive materials. In some embodiments, in order to manufacture the thicker connection pads P1 and P2, the connection pads P1 and P2 could be formed by, for example, plating, printing, or evaporation and lift-off patterning.

Figure 9C:
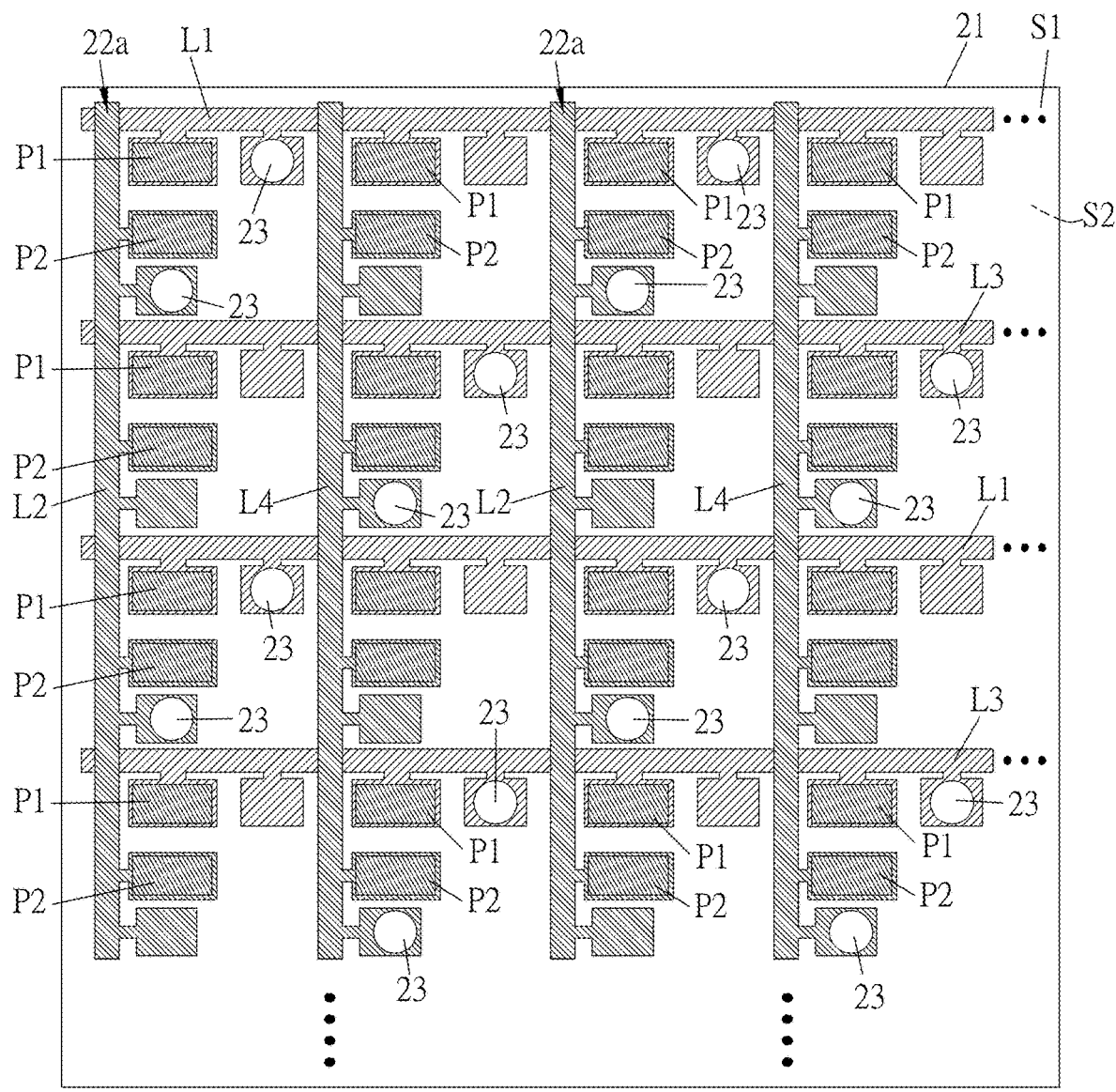

Next, as shown in FIG. 9C, the substrate 21 is selectively drilled to form a plurality of through holes 23, wherein the through holes 23 communicate the first surface S1 and the second surface S2 of the substrate 21, and the through holes 23 are individually corresponding to the signal lines L1-L4. In some embodiments, the step of providing a plurality of surface mount structures further comprises: configuring each of the signal lines L1-L4 of the surface mount structure 2a to correspond to two or more through holes 23. Due to the configuration of the commonly used through holes 23, the component density of the electronic device could be increased, and the cost could be decreased. To be noted, the executing order of the step of forming the connection pads P1 and P2 and the step of selectively drilling could be changed.

Figure 9D:
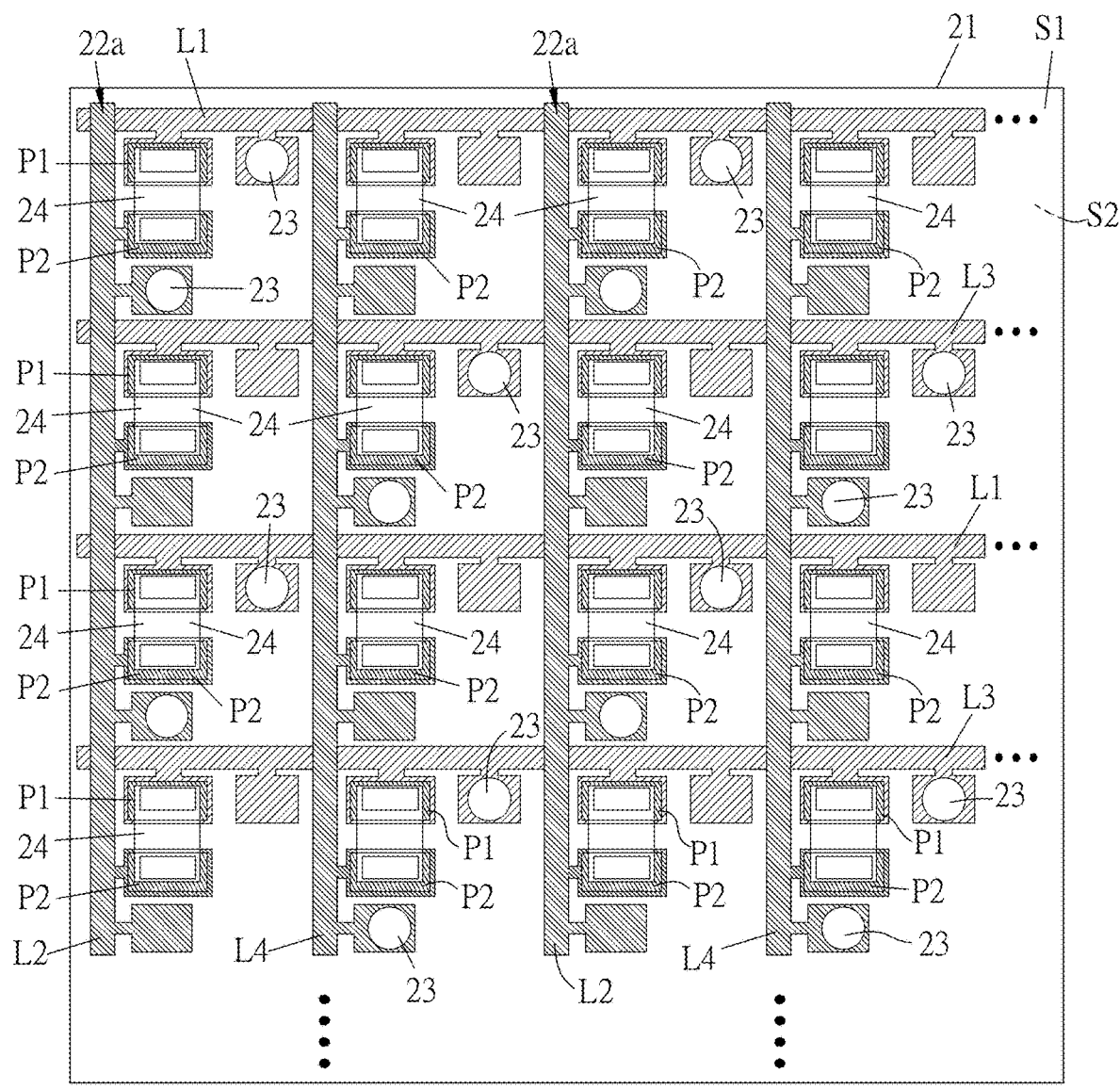

Then, as shown in FIG. 9D, the process of disposing the optoelectronic elements 24 is performed to dispose a plurality of optoelectronic elements 24 on the corresponding connection pads P1 and P2, and two ends of each optoelectronic element 24 could be respectively electrically connected to the corresponding signal lines L1-L4 of the pattern circuit 22.

Figure 9E:
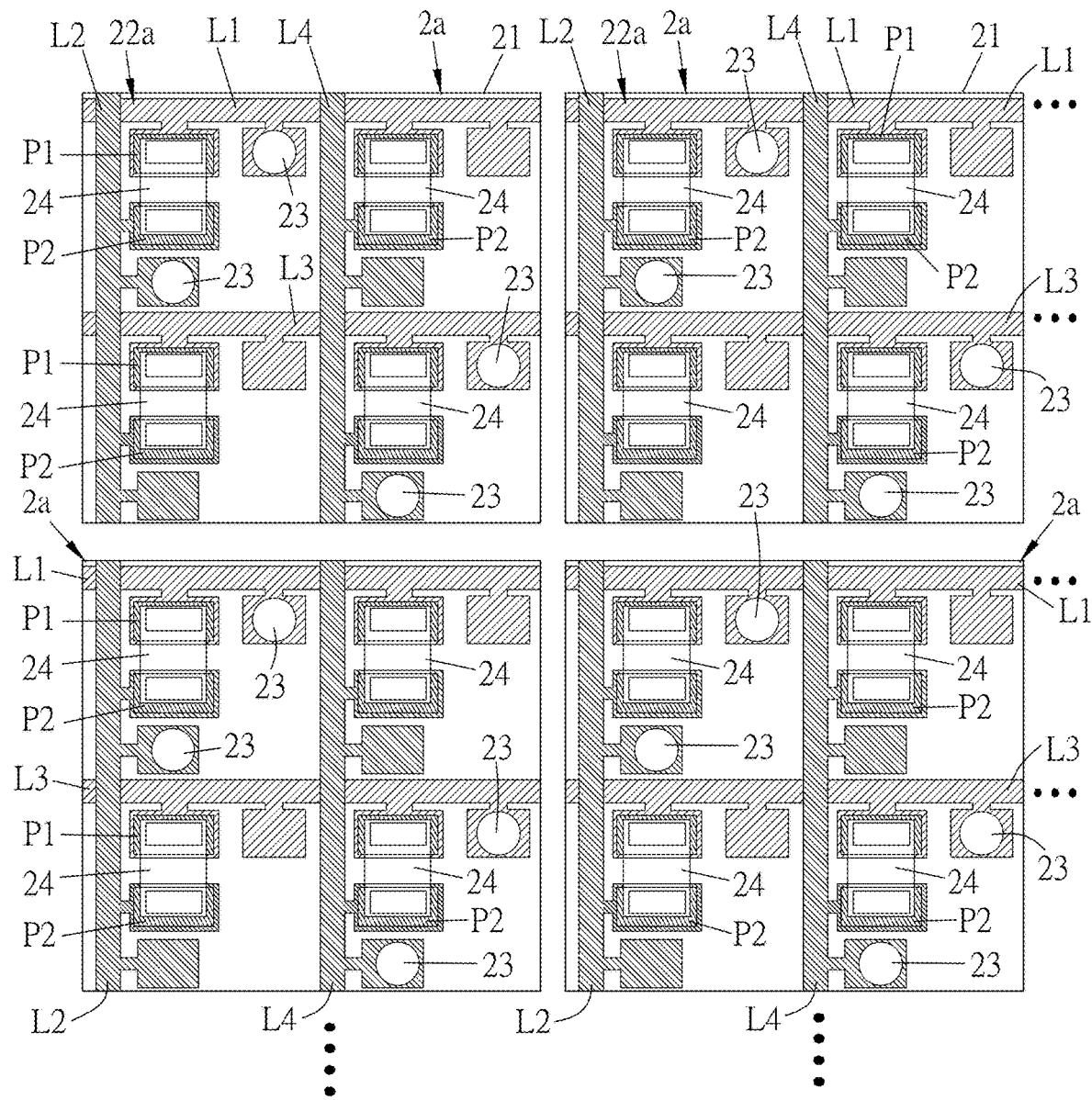

Next, as shown in FIG. 9E, a cutting process is performed to obtain a plurality of surface mount structures 2a. The structure of the surface mount structure 2a of FIG. 9E is the same as that of the surface mount structure 2a of FIG. 5A, so that the detailed technical content thereof could be referred to the descriptions of FIGS. 5A to 5E, and the detailed descriptions thereof will be omitted here. In some embodiments, the step of providing a plurality of surface mount structures 2a further comprises: configuring a plurality of optoelectronic elements 24 in each surface mount structure 2a, wherein each optoelectronic element 24 comprises one or more chips. To be noted, the cutting process could be performed after the step of FIG. 9A, FIG. 9B, FIG. 9C, or FIG. 9D depending on the processing machine of each step and the processing function of the corresponding post-process.

Figure 9F:
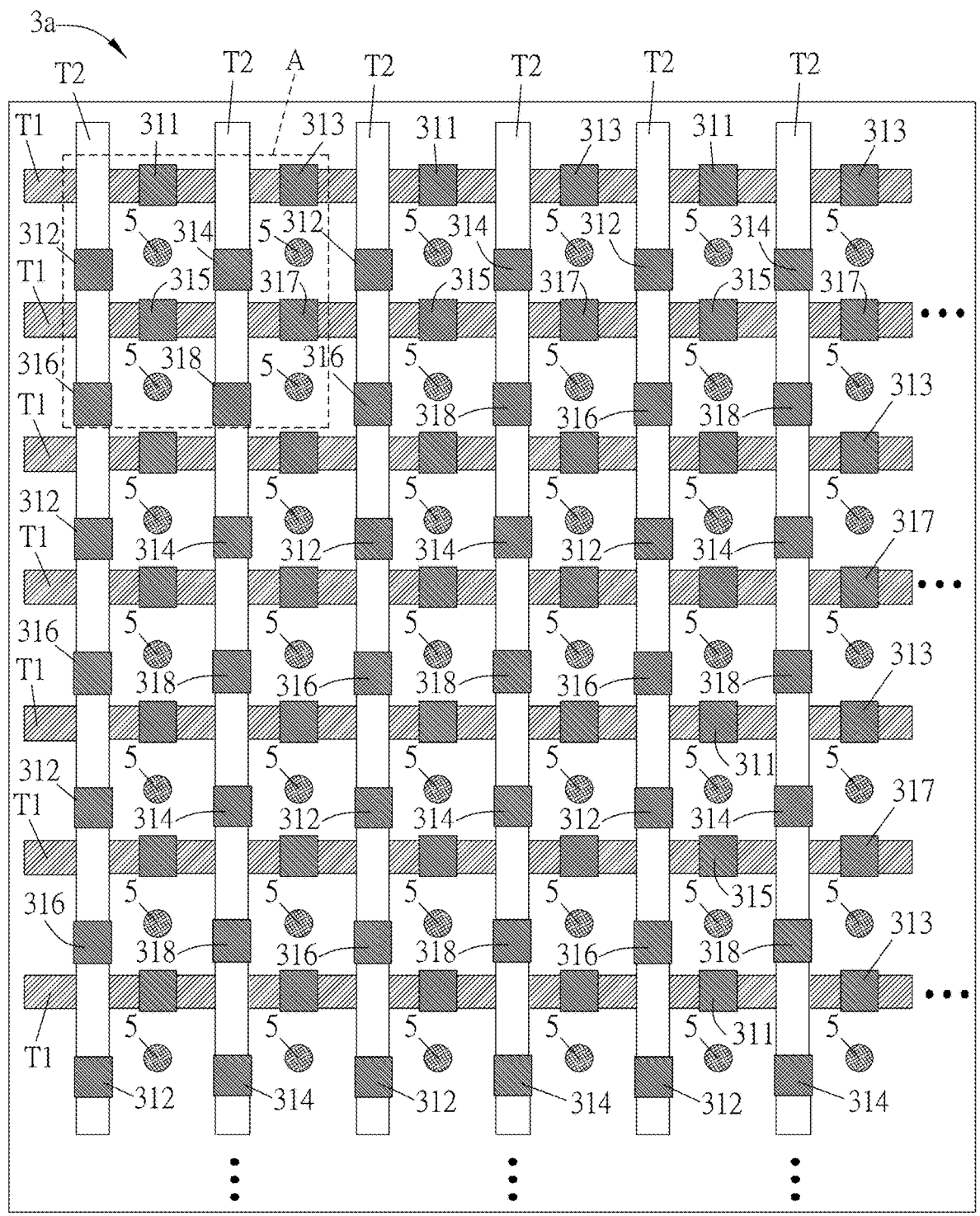

Afterwards, the surface mount structures 2a of FIG. 9E are sequentially disposed on the driving circuit board 3a of FIG. 9F. To be noted, before the step of sequentially disposing the surface mount structures 2a on the driving circuit board 3a, in order to pre-fix the surface mount structures 2a, as shown in FIG. 9F, the step of providing the driving circuit board 3a further comprises: forming a plurality of adhesion members 5 on a surface of the driving circuit board 3a, which is configured with a plurality of connection pad groups, wherein each surface mount structure 2a is disposed corresponding to and positioned on the driving circuit board 3a through each adhesion member 5. Herein, each adhesion member 5 could be, for example, a red adhesive for (temporarily) fixing the surface mount structures 2a on the driving circuit board 3a (see FIG. 9G). Then, as shown in FIG. 9H, the process for disposing the conductive material in the through holes 23 is performed. In this embodiment, the conductive material is jetted in the through holes 23 to form the conductive members 41, so that each conductive member 41 could extend to the first surface S1 and the second surface S2 of the substrate 21 (as shown in FIG. 9I). Then, a reflow process is performed to electrically connect the surface mount structure 2a to the driving circuit board 3a. Herein, the conductive material could be, for example but not limited to, a solder paste, a silver paste, an ACF, or a combination thereof, or any of other suitable materials, and this disclosure is not limited. This embodiment is to optionally jetting the conductive material in the through holes 23 so as to form the conductive members 41. Moreover, in other embodiments, the conductive material can be disposed by, for example, dispensing, sputtering or electroplating, and this disclosure is not limited. In some embodiments, the step of disposing the conductive material further comprises: optionally jetting the conductive material into the through holes 23 to form the conductive members 41, wherein the number of the conductive members 41 is less than the number of the through holes 23. This configuration could decrease the manufacturing cost of the electronic device.

Figure 9G:
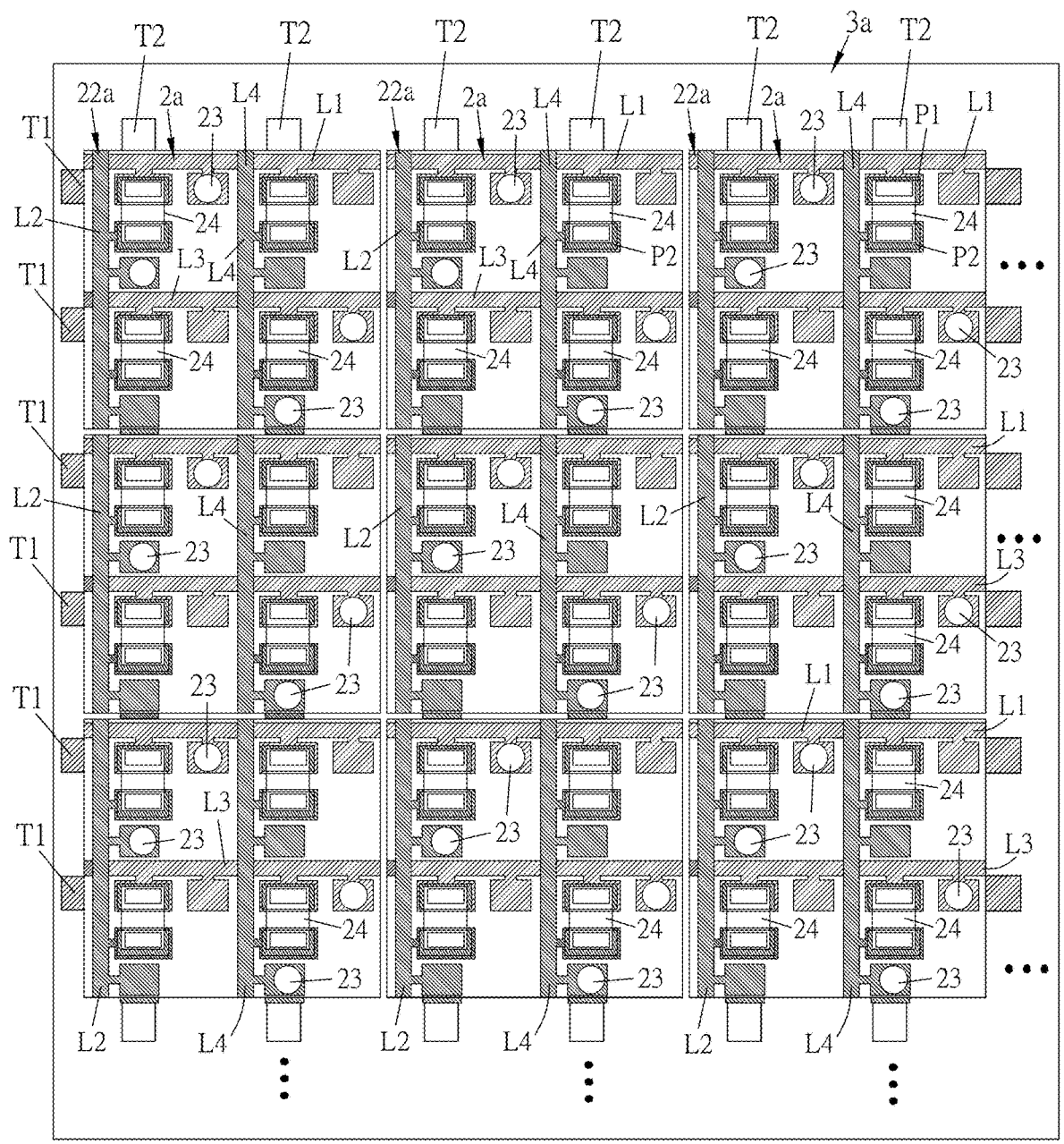
Figure 9H:
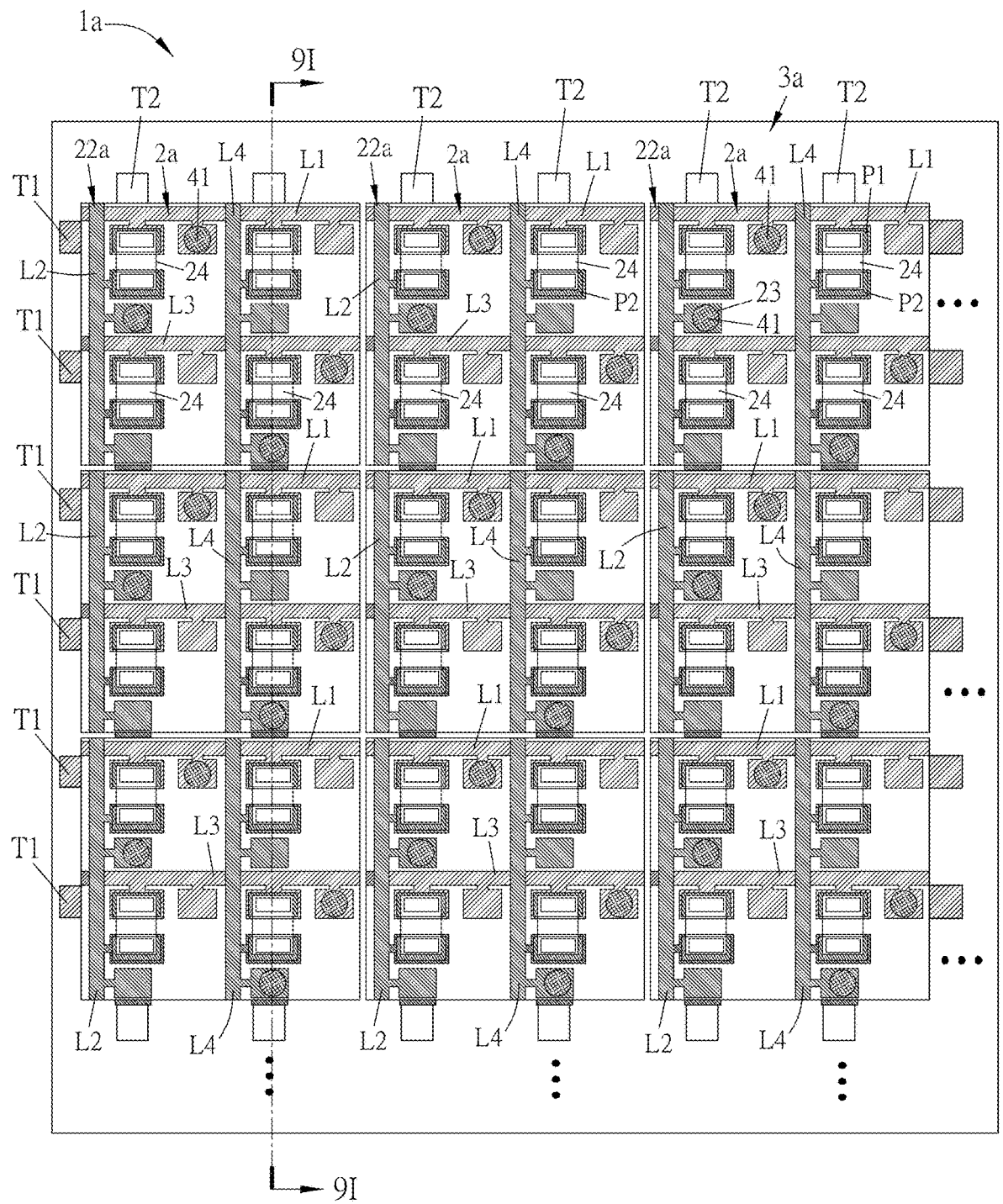
Figure 9I:
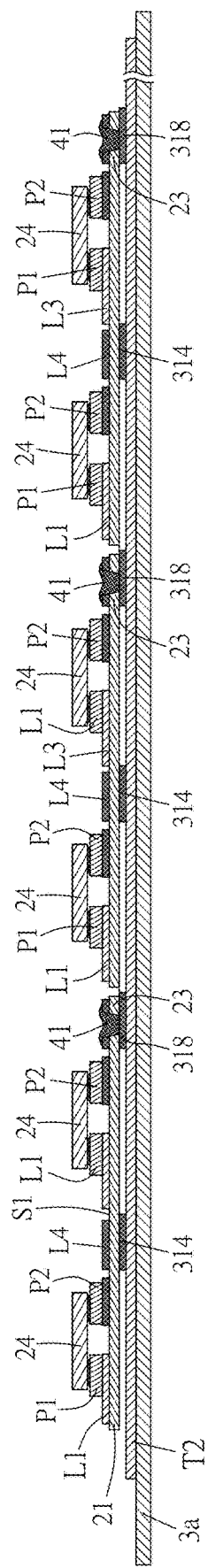
FIG. 9I is a sectional view of FIG. 9H along the line 9I-9I.

To be noted, as shown in FIG. 9G, the conductive material (the conductive members 41) is not disposed in the through holes 23 yet, so that before or after the step of disposing the conductive material, the manufacturing method further comprises: discontinuously coating an encapsulation layer (or a protection layer/an insulation layer, not shown) on the substrate 21 of the surface mount structure 2a for covering each of the optoelectronic elements 24, wherein the encapsulation layer does not cover the at through holes 23 (so the conductive material could be filled into the through holes 23). In this embodiment, the encapsulation layer could be provided to cover the optoelectronic elements 24 and the pattern circuit 22a by resin transfer molding, sealant dispensing, or any of other suitable methods, for protecting the optoelectronic elements 24 and the pattern circuit 22a from the damage of external objects or the following processes. In addition, in some embodiments, after the step of disposing the conductive material to form the conductive members 41, the manufacturing method further comprises: continuously or discontinuously coating an encapsulation layer on the substrate 21 of the surface mount structure 2a for covering each of the optoelectronic elements 24. Herein, since the process for disposing the conductive members 41 has been performed in FIG. 9H, the encapsulation layer could be provided to protect the components, patterns or circuits (including the through holes 23) on the first surface S1 of the substrate 21 of each surface mount structure 2a from the damage of external objects or the following processes.

Figure 10A:
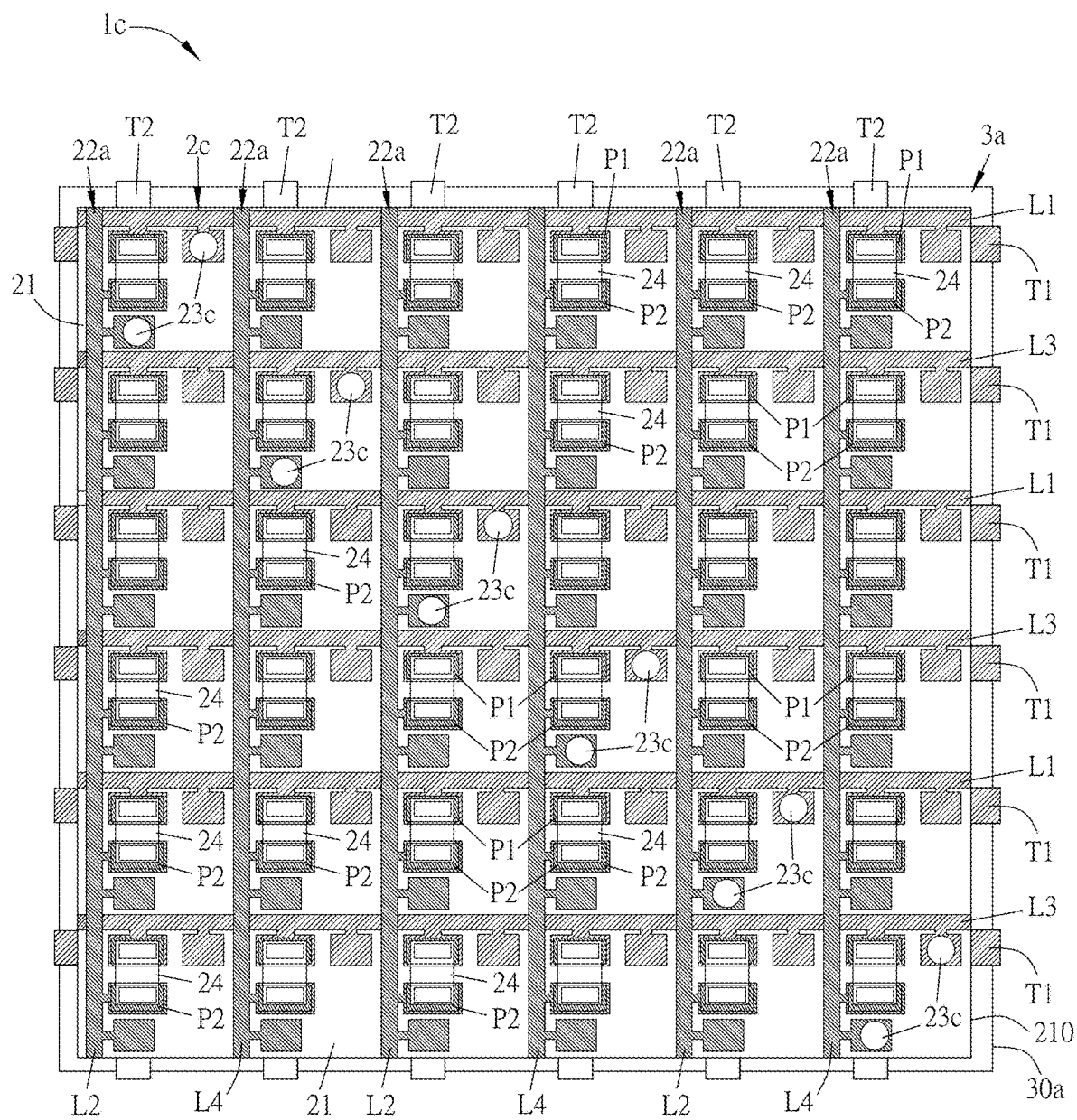
FIGS. 10A and 10B are schematic diagrams showing the manufacturing procedure of an electronic device according to another embodiment of this disclosure.
Figure 10B:
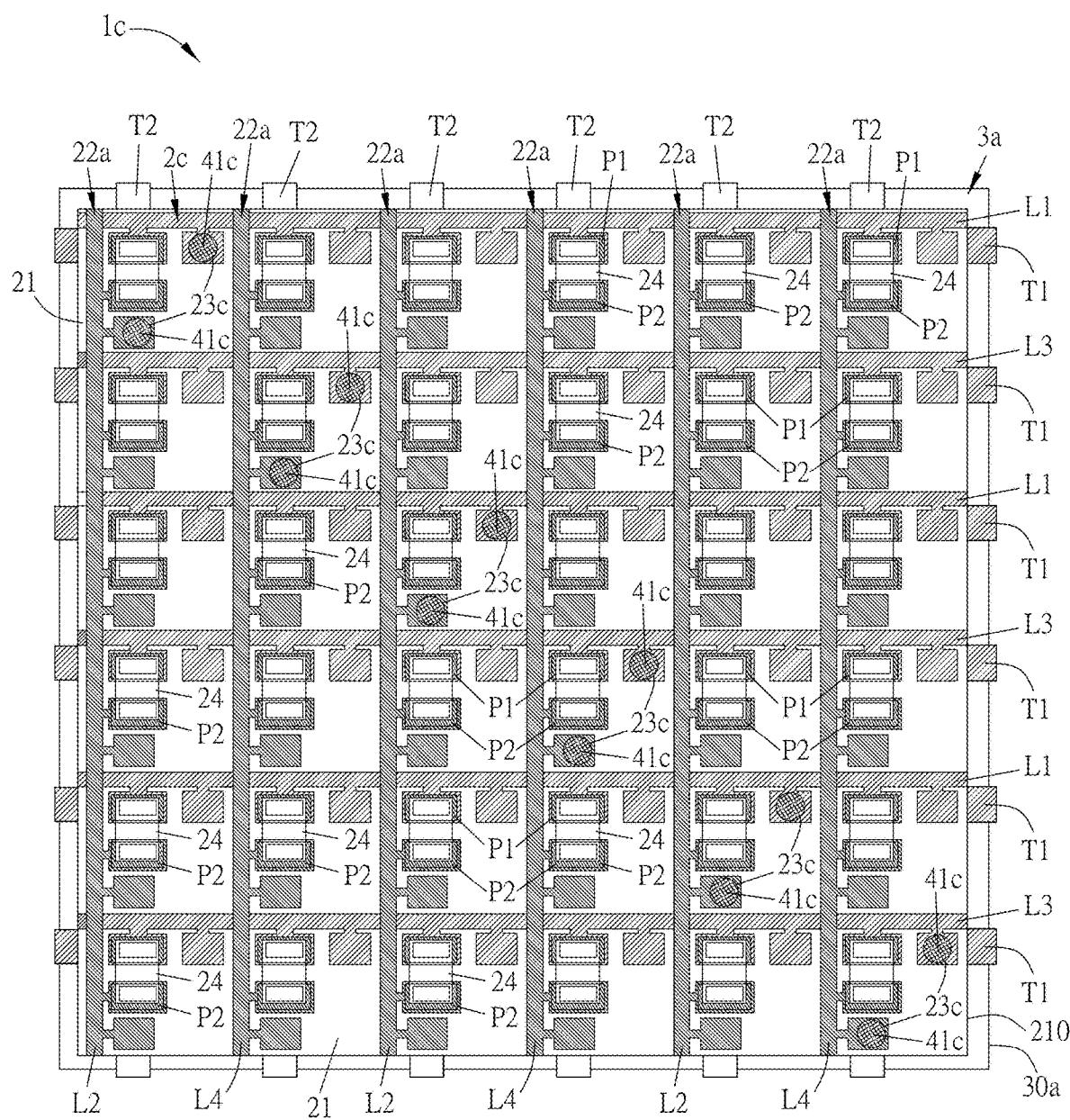

Please refer to FIGS. 10A and 10B, wherein FIGS. 10A and 10B are schematic diagrams showing the manufacturing procedure of an electronic device 1c according to another embodiment of this disclosure.

For easy understanding, FIG. 10A is a continuation of FIG. 9D. After FIG. 9D, the substrate 21 configured with the pattern circuits 22a, the connection pads P1 and P2, and the through holes 23 is processed with a cutting process. Different from FIG. 9E, the substrate 21 of this embodiment obtained after the cutting process has a size approaching the size of the driving circuit board. Herein, the driving circuit board of FIG. 10A could be the driving circuit board 3a of FIG. 6 or FIG. 9. Accordingly, the size of the surface mount structure 2a of FIG. 9G is much smaller than that of the driving circuit board 3a, and a plurality of surface mount structures 2a are arranged in an array on the driving circuit board 3a. In this embodiment of FIG. 10A, one surface mount structure 2c is correspondingly disposed on the driving circuit board 3a (in this embodiment, the size of the driving circuit board 3a is slightly larger than that of the surface mount structure 2c). To be noted, the cutting process of the substrate 21 could still be performed between the two steps between FIG. 9A and FIG. 9E, as long as the final surface mount structure 2c and the driving circuit board 3a are configured in the one-on-one manner.

Similarly, in order to fix the surface mount structure 2c, at least one adhesion member 5 could be disposed on the driving circuit board in advance, and the process for optionally disposing the conductive material in the through holes 23c as shown in FIG. 10B could be performed. As mentioned above, the conductive material could be optionally disposed into the through holes 23c by jetting, and the following reflow process is performed to form the conductive members 41c. In this embodiment, one surface mount structure 2c, one connection pad group and one conductive member unit are corresponding to each other. Herein, the surface mount structure 2c comprises a plurality of through holes 23c, the connection pad group comprises a plurality of connection pads, and the conductive member unit comprises a plurality of conductive members 41c. The implements and arrangements of the above three elements could be referred to the above-mentioned embodiments. For example, the through holes 23c are not disposed at the periphery of the substrate 21, the number of the conductive members 41c is equal to the number of the through holes 23c, the surface mount structure 2c is configured with two or more signal lines and two or more optoelectronic elements 24, each signal line corresponds to two or more through holes 23c, and at least two optoelectronic elements 24 share the same one through hole 23c and the conductive member 41c corresponding to the shared through hole 23c on the same signal line. In addition, the through holes 23c of FIGS. 10A and 10B are in the configuration of minimum amount. However, in some embodiments that the amount of through holes 23c is not in the configuration of minimum amount, the number of the conductive members 41c could be selectively less than the number of the through holes 23c.

To be noted, the dimension of the above-mentioned substrate 21 is close to the dimension of the driving circuit board 3a in at least one direction. For example, the substrate 21 could be slightly longer than, slightly shorter than, or the same as the driving circuit board 3a in the X-axis direction. In the embodiment as shown in FIGS. 10A and 10B, in the X-axis direction, the driving circuit board 3a defines two side edges 30a, and the substrate 21 defines two side edges 210. The two side edges 210 of the substrate 21 are both slightly shorter than the two side edges 30a of the driving circuit board 3a in the X-axis direction, but this disclosure is not limited thereto. In other words, each of the driving circuit board and the substrate defines at least one side edge along at least one direction, and the side edge of the circuit board and the side edge of the substrate define a gap, which could be zero or not. Each of the driving circuit board and the substrate defines two side edges along the X-axis (or Y-axis) direction. To be noted, the gaps between the side edge of the driving circuit board and the side edge of the substrate could be, for example but not limited to, the same or symmetric. When the gap between the side edge of the driving circuit board and the side edge of the substrate is zero, the two side edges are even to each other.

In addition, a plurality of optoelectronic elements are configured, and the optoelectronic elements define the pixel pitch. The gap between the side edge of the driving circuit board and the side edge of the substrate is less than a predetermined distance, such as two times of the pixel pitch along the X-axis (or Y-axis) direction. This configuration is advantageous to splice with another electronic device with the same or similar structure. For example, in some embodiments, a plurality of electronic devices are spliced with each other along the X-axis direction (and the Y-axis direction). In one of the electronic devices, the gap between the side edge of the driving circuit board and the side edge of the substrate is less than two times of the pixel pitch along the X-axis direction. In another one of the electronic devices, which splices with the previous electronic device, the gap between the side edge of the driving circuit board and the side edge of the substrate is also less than two times of the pixel pitch along the X-axis direction. Thus, the pixel pitches between the two electronic devices are less than two times of the pixel pitch of each electronic device.

Figure 11A:
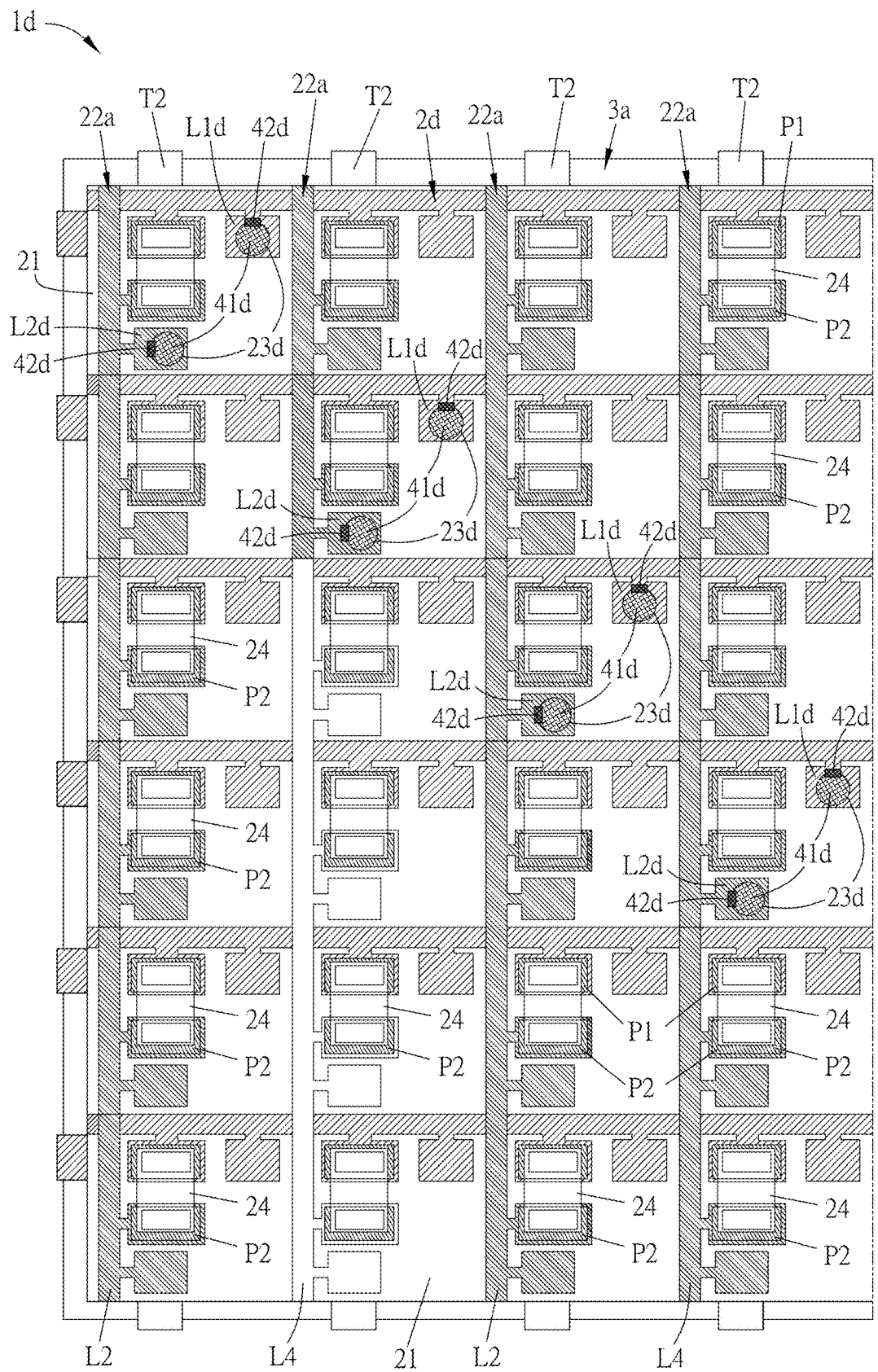
FIGS. 11A and 11B are partial enlarged views of an electronic device according to another embodiment of this disclosure.
Figure 11B:
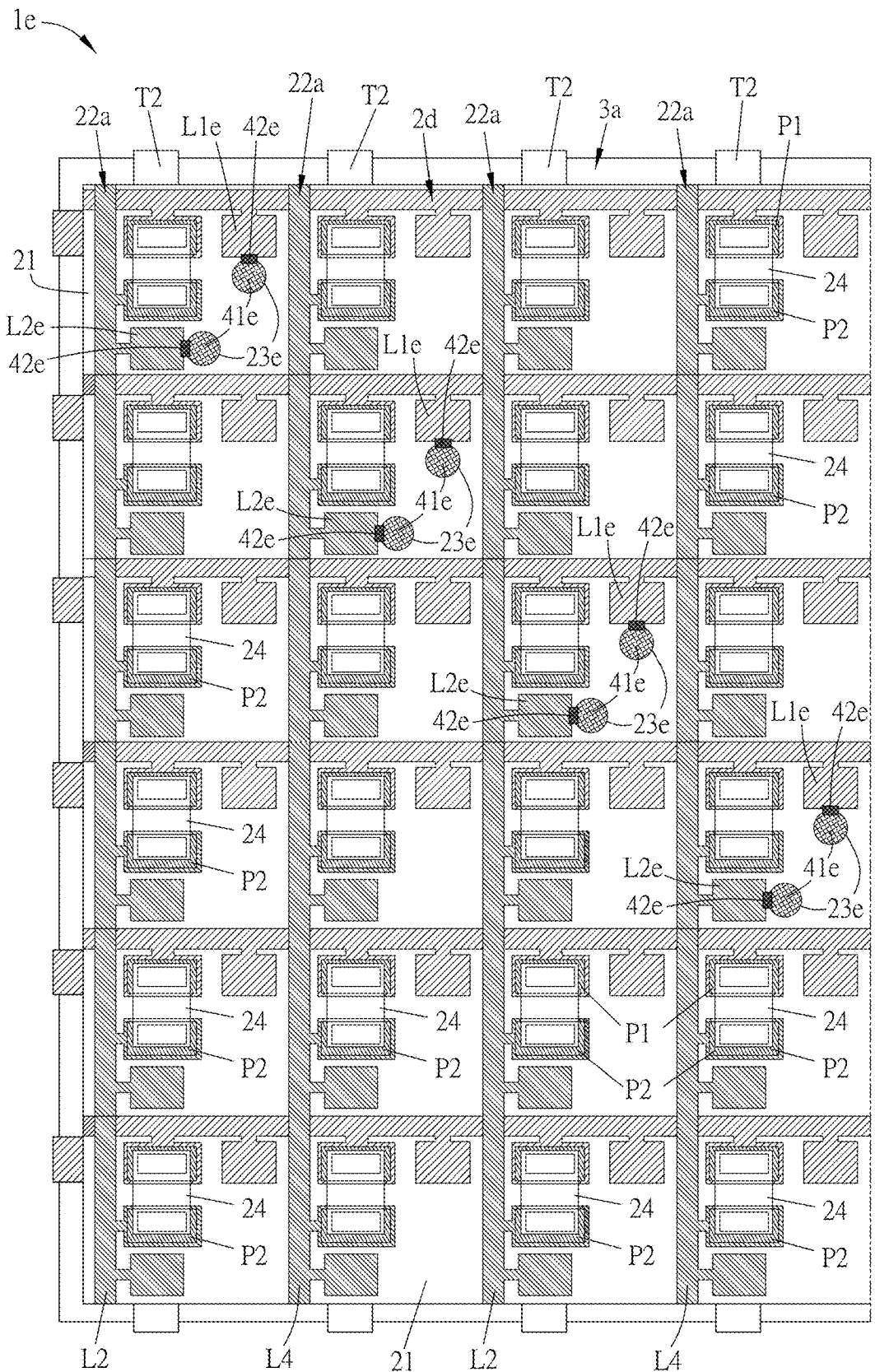

FIGS. 11A and 11B are partial enlarged views of an electronic device according to another embodiment of this disclosure. As shown in FIG. 11A, different from the surface mount structure 2c of the previous embodiment, on the substrate 21 of the surface mount structure 2d of FIG. 11A, the through holes 23d are disposed on the conductive pads L1d and L2d extending from the at least two signal lines, respectively. After the conductive material (conductive members 41d) is disposed in the through holes 23d, the conductive sub-members 42d are disposed above the through holes 23d, and the conductive sub-member 42d could be at least partially overlapped with the through hole 23d and the conductive pad L1d (or the through hole 23d and the conductive pad L2d). Then, the conductive sub-members 42d could be electrically connected to both of the conductive member 41d and the conductive pad L1d (or the conductive pad L2d) by, for example, the reflow process. The conductive sub-members 42d could provide a proper force to the conductive member 41d for decreasing the risk of non-effective connection between the conductive member 41d and the conductive pad L1d (or the conductive pad L2d) caused by the shrinking of the conductive member 41d inside the through hole 23d. In some embodiments, the conductive sub-members 42d could be a micro resistor, such as a 0402 micro resistor with a dimension of 0.04 inch*0.02 inch. In some embodiments, the number of the conductive sub-members 42d could be configured based on the number of the conductive members 41d. In some embodiments, as shown in FIG. 11i, the surface mount structure 2e is disposed on the substrate 21, each through hole 23e is disposed adjacent to the conductive pads L1e and L2e extending from the at least two signal lines, the conductive sub-member 42e is at least partially overlapped with the through hole 23e and the conductive pad L1e (or the conductive pad L2e), and the conductive sub-members 42e are electrically connected to both of the conductive member 41e and the conductive pad L1e (or the conductive pad L2e).

In summary, in the electronic device and the manufacturing method thereof of this disclosure, at least one surface mount structure is connected to the driving circuit board through at least one conductive member, and the configuration of the amount of the surface mount structure and the driving circuit board could be the case of multiple surface mount structures to one driving circuit board, the case of one surface mount structure to one driving circuit board, or, under a specific consideration, the case of one surface mount structure to multiple driving circuit boards. Each surface mount structure has a substrate, a pattern circuit, at least two through holes, and at least one optoelectronic element. The pattern circuit comprises at least two signal lines. The at least two through holes communicate the first surface and the second surface of the substrate, and the at least two through holes are disposed corresponding to the at least two signal lines, respectively. The at least one optoelectronic element is disposed on the first surface of the substrate, and two ends of the at least one optoelectronic element are respectively electrically connected to the at least two signal lines of the pattern circuit. The connection pad group of the driving circuit board comprises at least two connection pads, and the at least two connection pads are respectively corresponding to the at least two through holes of the surface mount structure. At least two conductive members of each conductive member unit are disposed in the at least two through holes of the surface mount structure, respectively, and extending to the first surface and the second surface of the substrate. The at least two conductive members disposed in the at least two through holes electrically connect the at least two signal lines of each of the surface mounting structures to the at least two connection pads of each of the connection pad groups of the driving circuit board. The surface mount structure and the driving circuit board could be made through separate manufacturing processes and are independent components, and through the method within the scope of this disclosure or any equivalent implementation method thereof, various arrangements and combinations of different numbers of the surface mount structures and the driving circuit board are possible, so that the flexibility and applications thereof are quite extensive. The respective embodiments will be described hereinbelow. In addition, since the surface mount structures and the driving circuit board are independent to each other and are not limited to be manufactured by the same manufacturing process, so that the manufacturing cost could be decreased due to, for example, avoiding the step of preparing new photomask for different designs. The electronic device and manufacturing method thereof of this disclosure are different from the conventional surface mount component and the driving circuit board connection technology.

In addition, the surface mount structures and the drive circuit board are independent to each other. For example, the surface mount structure made of polyimide substrate and the drive circuit board made based on the epoxy resin with flame resistance grade of FR4 can be combined with each other, thereby combining the advantages of precise manufacturing processes on the polyimide substrate and the mechanical strength of the epoxy resin drive circuit board. Herein, these advantages of combining independent heterogeneous materials are more prominent especially in the case that the size of the substrate is close to the size of the drive circuit board (e.g. the side edge of the driving circuit board and the side edge of the substrate are close to each other in at least one direction).

In addition, the electronic device could further comprise the conductive sub-members or the conductive sub-pad connected to the conductive sub-members. The conductive sub-members could provide a proper force to the conductive members for decreasing the risk of non-effective connection between the conductive member and the conductive pad caused by the shrinking of the conductive member inside the through hole.

Moreover, in some embodiments of this disclosure, the configuration of the commonly used through holes in the surface mount structures could not only increase the component density of the electronic device, but also decrease the manufacturing cost of the electronic device. In addition, in some embodiments of this disclosure, the manufacturing cost of the electronic device could be decreased by configuring the number of the conductive members to be less than the number of the through holes of the surface mount structure in the electronic device.

To be noted, the numbers of the conductive member units, the surface mount structures, and the drive circuit boards of the electronic device of this disclosure is not limited. The measure words or antecedent basis of each component are not limited to "at least one" or ""one". The term "one" in this disclosure should be understood as "one" or "at least one". Therefore, in order to facilitate reading and understanding, this disclosure uses the measure words or antecedent basis of "one" to describe the various embodiments. However, it is not limited to the understanding of each embodiment. In other words, this disclosure could also replace the term "one" in various embodiments by "at least one". For example, the electronic device of this disclosure comprises at least one surface mount structure, at least one driving circuit board, and at least one conductive member unit. The at least one surface mount structure comprises a substrate, a pattern circuit, at least two through holes, and at least one optoelectronic element. The substrate defines a first surface and a second surface opposite to each other. The pattern circuit is disposed on the first surface of the substrate, and the pattern circuit comprises at least two signal lines. At least two through holes communicate with the first surface and the second surface of the substrate, and the at least two through holes respectively correspond to the at least two signal lines. At least one optoelectronic element is disposed on the first surface of the substrate, and two ends thereof are respectively electrically connected to at least two signal lines of the pattern circuit. At least one drive circuit board comprises at least one connection pad group. The at least one connection pad group corresponds to at least one surface mount structure, and the second surface of the substrate of at least one surface mount structure is disposed on a surface of the at least one drive circuit board configured with at least one connection pad group. The at least one connection pad group comprises at least two connection pads, and the at least two connection pads respectively correspond to at least two through holes of the at least one surface mount structure. At least one conductive member unit corresponds to at least one surface mount structure. The at least one conductive member unit has at least two conductive members, and the at least two conductive members are correspondingly disposed in at least two through holes of the at least one surface mount structure and extending to the first surface and the second surface of the substrate. Herein, the at least two conductive members respectively disposed in the at least two through holes electrically connect the at least two signal lines of the at least one surface mount structure to the at least two connection pads of the at least one connection pad group of the at least one drive circuit board.

The above descriptions are only illustrative and are not restrictive. Any equivalent modifications or alterations that do not depart from the spirit and scope of the present disclosure should be included in the scope of the following claims.

What is claimed is:

1. An electronic device, comprising:
a surface mount structure, comprising:
a substrate defined with a first surface and a second surface opposite to each other;
a pattern circuit disposed on the first surface of the substrate, wherein the pattern circuit comprises at least two signal lines;
at least two through holes communicating the first surface and the second surface of the substrate, wherein the at least two through holes are disposed corresponding to the at least two signal lines, respectively; and
at least one optoelectronic element disposed on the first surface of the substrate, wherein two ends of the at least one optoelectronic element are respectively electrically connected to the at least two signal lines of the pattern circuit;
a driving circuit board comprising a connection pad group, wherein the connection pad group is disposed corresponding to the surface mount structure, the second surface of the substrate of the surface mount structure is disposed on a surface of the driving circuit board configured with the connection pad group, the connection pad group comprises at least two connection pads, and the at least two connection pads are respectively corresponding to the at least two through holes of the surface mount structure; and
a conductive member unit corresponding to the surface mount structure, wherein the conductive member unit comprises at least two conductive members, the at least two conductive members are disposed in the at least two through holes of the surface mount structure, respectively, and extending to the first surface and the second surface of the substrate, and the at least two conductive members disposed in the at least two through holes electrically connect the at least two signal lines of the surface mounting structure to the at least two connection pads of the connection pad group of the driving circuit board.

2. The electronic device of claim 1, wherein a material of the conductive members comprises a solder paste, a copper paste, a silver paste, or a combination thereof.

3. The electronic device of claim 1, further comprising:
at least one adhesion member disposed between the surface mount structure and the driving circuit board.

4. The electronic device of claim 1, wherein each of the driving circuit board and the substrate defines a side edge along a direction, and the side edge of the driving circuit board and the side edge of the substrate define a gap.

5. The electronic device of claim 4, wherein the electronic device comprises a plurality of the optoelectronic elements, the plurality of optoelectronic elements define a pixel pitch, and the gap between the side edge of the driving circuit board and the side edge of the substrate is less than two times of the pixel pitch along the direction.

6. The electronic device of claim 1, further comprising:
a conductive sub-member at least partially overlapped with the through hole and electrically connected to the conductive member located in the through hole and a conductive pad extended from a corresponding one of the signal lines.

7. The electronic device of claim 1, wherein the substrate of the surface mount structure further defined with a periphery connecting to the first surface and the second surface, and the at least two through holes are not located at the periphery of the substrate.

8. The electronic device of claim 1, wherein in the surface mount structure and the corresponding conductive member unit, a number of the conductive members is less than a number of the through holes.

9. The electronic device of claim 1, wherein the surface mount structure is configured with two or more of the signal lines and two or more of the optoelectronic elements, each of the signal lines corresponds to at least two of the through holes, and at least two of the optoelectronic elements on one of the signal lines share one of the through holes and the corresponding conductive member.

10. The electronic device of claim 1, wherein the at least one optoelectronic element of the surface mount structure comprises a chip or a package, the chip or the package comprises one or more LEDs, one or more mini LEDs, one or more micro LEDs, one or more image sensors, or any of their combination.

11. The electronic device of claim 1, wherein the pattern circuit of the surface mount structure comprises a thin-film circuit or a thin-film element.

12. The electronic device of claim 1, wherein the pattern circuit further comprises at least two conductive pads extending from the at least two signal lines, respectively, and the at least two through holes are disposed on the at least two conductive pads extending from the at least two signal lines, respectively.

13. An electronic device, comprising:
a plurality of surface mount structures, wherein each of the surface mount structures comprises:
a substrate defined with a first surface and a second surface opposite to each other,
a pattern circuit disposed on the first surface of the substrate, wherein the pattern circuit comprises at least two signal lines,
at least two through holes communicating the first surface and the second surface of the substrate, wherein the at least two through holes are disposed corresponding to the at least two signal lines, respectively, and
at least one optoelectronic element disposed on the first surface of the substrate, wherein two ends of the at least one optoelectronic element are respectively electrically connected to the at least two signal lines of the pattern circuit;
a driving circuit board comprising a plurality of connection pad groups, wherein the plurality of connection pad groups are disposed corresponding to the plurality of surface mount structures, respectively, the second surfaces of the substrates of the plurality of surface mount structures are disposed on a surface of the driving circuit board configured with the plurality of connection pad groups, each of the plurality of connection pad groups comprises at least two connection pads respectively corresponding to the at least two through holes of one of the plurality of surface mount structures; and
a plurality of conductive member units corresponding to the plurality of surface mount structures, wherein each of the plurality of conductive member units comprises at least two conductive members, the at least two conductive members of one of the plurality of conductive member units are disposed in the at least two through holes of one of the plurality of surface mount structures, respectively, extend to the first surface and the second surface of the substrate of the one of the plurality of surface mount structures, and electrically connect the at least two signal lines of one of the plurality of surface mounting structures to the at least two connection pads of one of the plurality of connection pad groups of the driving circuit board.

* * * * *